US009203023B2

(12) United States Patent
Saitoh et al.

(10) Patent No.: US 9,203,023 B2
(45) Date of Patent: Dec. 1, 2015

(54) SEMICONDUCTOR MEMORY DEVICE AND A METHOD OF MANUFACTURING THE SAME

(71) Applicant: KABUSHIKI KAISHA TOSHIBA, Minato-ku (JP)

(72) Inventors: Masumi Saitoh, Yokkaichi (JP); Chika Tanaka, Yokohama (JP); Kikuko Sugimae, Kuwana (JP); Takuya Konno, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/578,714

(22) Filed: Dec. 22, 2014

(65) Prior Publication Data

US 2015/0243887 A1 Aug. 27, 2015

(30) Foreign Application Priority Data

Feb. 25, 2014 (JP) .................................. 2014-34587

(51) Int. Cl.
*H01L 27/115* (2006.01)
*H01L 45/00* (2006.01)
*H01L 27/24* (2006.01)
(Continued)

(52) U.S. Cl.
CPC ............ *H01L 45/1253* (2013.01); *H01L 25/50* (2013.01); *H01L 27/0688* (2013.01); *H01L 27/1052* (2013.01); *H01L 27/115* (2013.01);
(Continued)

(58) Field of Classification Search
CPC . H01L 25/50; H01L 27/1052; H01L 27/0688; H01L 27/2436; H01L 27/228; H01L 27/115

USPC .......................... 257/392, 401; 438/129, 276
See application file for complete search history.

(56) References Cited

U.S. PATENT DOCUMENTS

| 6,649,980 B2* | 11/2003 | Noguchi ....................... 257/351 |
| 2009/0296477 A1* | 12/2009 | Kim et al. ................. 365/185.17 |
| 2011/0002159 A1* | 1/2011 | Suzuki et al. ................. 365/149 |
| 2013/0153890 A1 | 6/2013 | Yoneda |

(Continued)

FOREIGN PATENT DOCUMENTS

| JP | 4-107859 | 4/1992 |
| JP | 2002-184993 | 6/2002 |
| JP | 2013-145878 | 7/2013 |

OTHER PUBLICATIONS

Shengdong Zhang, et al., "A Stacked CMOS Technology on SOI Substrate", IEEE Electron Device Letters, vol. 25, No. 9, Sep. 2004, pp. 661-663.

*Primary Examiner* — George Fourson, III
(74) *Attorney, Agent, or Firm* — Oblon, McClelland, Maier & Neustadt, L.L.P.

(57) ABSTRACT

A semiconductor memory device comprises a memory cell array. The memory cell array comprises a plurality of first wiring lines, a plurality of second wiring lines extending crossing the first wiring lines, and a plurality of memory cells disposed at intersections of the first and second wiring lines. The memory cells are stacked in a direction perpendicular to a substrate, and each memory cell comprises a variable resistance element. The semiconductor memory device also includes a select transistor layer comprising a plurality of select transistors, each select transistor being operative to select any one of the first wiring lines or one of the second wiring lines. Two select transistors are connected to two different respective first wiring lines, stacked in a direction perpendicular to the substrate, and configured to share one gate electrode.

14 Claims, 24 Drawing Sheets

(51) Int. Cl.
 *H01L 25/00* (2006.01)
 *H01L 27/22* (2006.01)
 *H01L 27/06* (2006.01)
 *H01L 27/105* (2006.01)

(52) U.S. Cl.
 CPC .......... *H01L 27/228* (2013.01); *H01L 27/2436* (2013.01); *H01L 45/16* (2013.01)

(56) References Cited

U.S. PATENT DOCUMENTS

| | | | |
|---|---|---|---|
| 2013/0200450 A1* | 8/2013 | Kusai et al. | 257/324 |
| 2013/0210211 A1* | 8/2013 | Vereen et al. | 438/382 |
| 2014/0284535 A1 | 9/2014 | Saitoh et al. | |
| 2015/0137066 A1* | 5/2015 | Lee | 257/5 |
| 2015/0214239 A1* | 7/2015 | Rhie | |

* cited by examiner

A - A' CROSS-SECTION

B - B' CROSS-SECTION

SEMICONDUCTOR MEMORY DEVICE AND A METHOD OF MANUFACTURING THE SAME

This application is based on and claims the benefit of priority from prior Japanese Patent Application No. 2014-34587, filed on Feb. 25, 2014, the entire contents of which are incorporated herein by reference.

FIELD

The embodiments described herein relate to a semiconductor memory device and a method of manufacturing the same.

BACKGROUND

Recently, as a successor to the flash memory, a resistive memory device including a variable resistance element as a memory element has drawn attention. Here, the resistive memory device shall include several kinds of devices including the strictly resistive RAM (ReRAM) and the phase change RAM (PCRAM). The ReRAM includes, as the recording layer, a transition metal oxide and stores its resistance value state in a non-volatile manner. The PCRAM includes, as the recording layer, a material such as chalcogenide and uses the resistance value information of its crystal state (conductor) and amorphous state (insulator).

The resistive memory device comprises a memory cell array. The memory cell array has memory cells disposed at intersections of bit-lines and word-lines. Each memory cell includes a variable resistance element. The memory cell array may use the characteristics of the variable resistance element to select one of the memory cells. In addition, an alternating stack of the bit-lines and the word-lines and a three-dimensional array of the memory cells may achieve the high density memory cell array.

In the high density memory cell array, a select transistor for selecting one of the bit-lines and one of the word-lines included in the memory cell array may also have a stacked structure similarly to the memory cell array. Unfortunately, if the memory cell array becomes highly densified, increasing the number of necessary select transistors, the arrangement and the manufacturing method of the select transistors become complicated.

DETAILED DESCRIPTION

Figure 1:
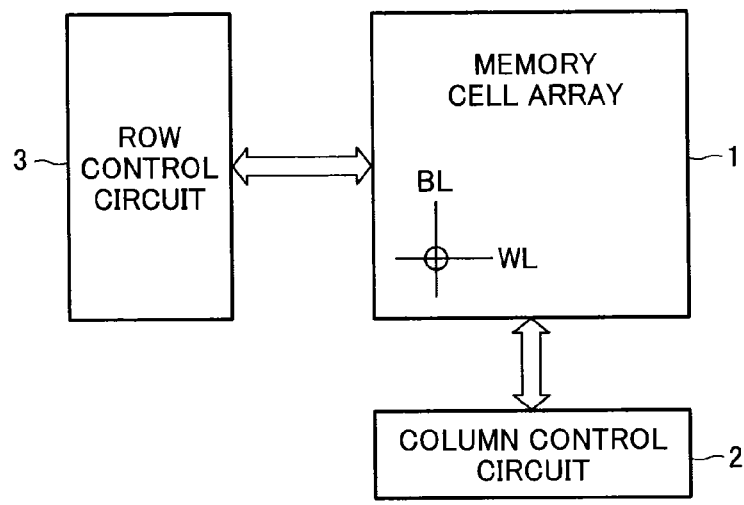
FIG. 1 is a block diagram of a semiconductor memory device according to a first embodiment.

A semiconductor memory device according to one embodiment comprising: a memory cell array, the memory cell array comprising a plurality of first wiring lines, a plurality of second wiring lines extending crossing the first wiring lines, and a plurality of memory cells disposed at intersections of the first and second wiring lines, the memory cells being stacked in a direction perpendicular to a substrate, each memory cell comprising a variable resistance element; and a select transistor layer comprising a plurality of select transistors, each select transistor being operative to select anyone of the first wiring lines or one of the second wiring lines. Two select transistors are connected to two different respective first wiring lines, stacked in a direction perpendicular to the substrate, and configured to share one gate electrode.

Next, with reference to the drawings, the embodiments will be described in more detail. Note that in the following description in the drawings of the embodiments, like elements are designated by like reference numerals, and repeated description thereof is omitted here.

[Entire Configuration]

FIG. 1 is a block diagram showing the configuration of a semiconductor memory device according to a first embodiment. The semiconductor memory device comprises a non-volatile memory. The non-volatile memory comprises a memory cell array 1. The memory cell array 1 has memory cells disposed in a matrix. Each memory cell comprises a variable resistance element VR described below.

The memory cell array 1 comprises a plurality of bit-lines BL. The bit-lines BL are electrically connected to a column control circuit 2. The column control circuit 2 controls the voltages of the bit-lines BL. The column control circuit 2 selects one of the bit-lines BL of the memory cell array 1 to perform data erase of the memory cell, data write to the memory cell, and data read from the memory cell. The memory cell array 1 also comprises a plurality of word-lines WL. The word-lines WL are electrically connected to a row control circuit 3. The row control circuit 3 controls the voltages of the word-lines WL. The row control circuit 3 selects one of the word-lines WL of the memory cell array 1 to perform the data erase of the memory cell, the data write to the memory cell, and the data read from the memory cell.

[Memory Cell Array 1]

Figure 2:
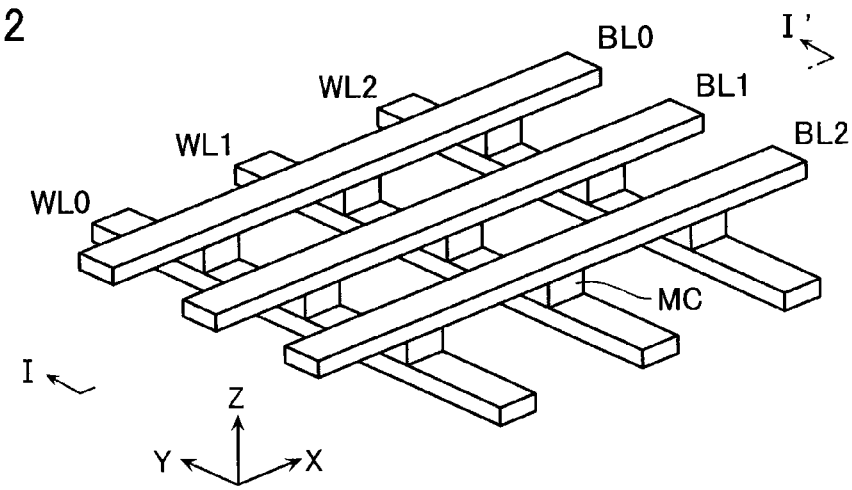
FIG. 2 is a perspective view of a part of a memory cell array 1 of the semiconductor memory device according to the first embodiment.
Figure 3:
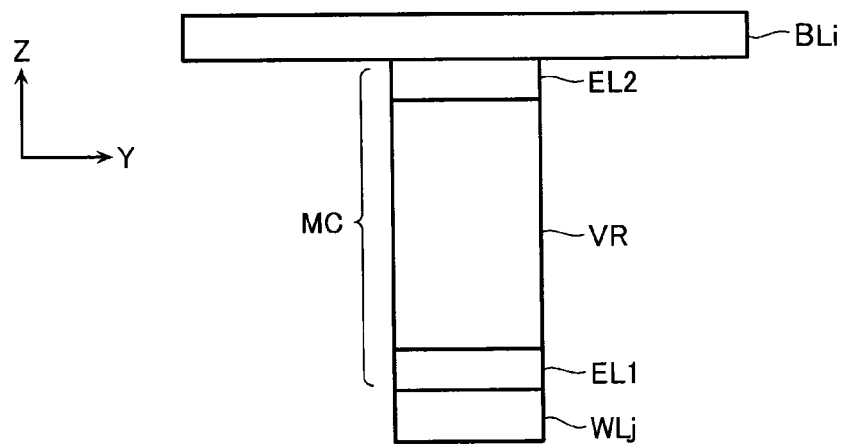
FIG. 3 is a cross-sectional view of one memory cell cut along the I-I' line in FIG. 2 and viewed in the arrow direction.

FIG. 2 is a perspective view of a part of the memory cell array 1. FIG. 3 is a cross-sectional view of one memory cell cut along the I-I' line in FIG. 2 and viewed in the arrow direction. As a plurality of first wiring lines, bit-lines BL0 to BL2 are provided in the Y-direction parallel to the surface of a not-shown substrate. As a plurality of second wiring lines crossing the bit-lines BL, word-lines WL0 to WL2 are provided in the X-direction parallel to the surface of the not-shown substrate. At the intersections of the word-lines WL0 to WL2 and the bit-lines BL0 to BL2, respective memory cells MC are disposed and sandwiched by both wiring lines. Preferably, the first and second wiring lines may comprise a material that has high heat resistance and a low resistance, such as W, WN, WSi, NiSi, CoSi, or the like.

[Memory Cell MC]

With reference to FIG. 3, the memory cell MC is a circuit having a variable resistance element VR connected between one of the bit-lines BL and one of the word-lines WL. Under and on the variable resistance element VR in the Z-direction, electrodes EL1 and EL2 are disposed, respectively. The electrodes EL1 and EL2 function as a barrier metal and a bonding layer. The variable resistance element VR is disposed on the electrode EL1 and the electrode EL2 is disposed on the variable resistance element VR. The electrode material of the electrode EL2 comprises a metal element that forms a conductive filament. The electrode EL2 comprises a metal element such as, for example, Ag, Ni, Co, Al, Zn, Ti, Ta, and Cu. The metal element ions used in the electrode EL2 move into the variable resistance element VR, thus forming the conductive filament. The electrode EL2 may further comprise a stack of impurity-doped silicon, W, Ti, $TiN_x$, $TiSi_x$, $TiSi_xN_y$, Ta, $TaN_x$, and $TaSi_xN_y$. The electrode EL1 may comprise various metal elements. The electrode EL1 may comprise, for example, impurity-doped silicon, W, Ti, $TiN_x$, $TiSi_x$, $TiSi_xN_y$, Ta, $TaN_x$, $TaSi_xN_y$, and a stacked structure thereof.

The electrodes EL1 and EL2 may comprise Au, Fe, Cr, Hf, Pt, Ru, Zr, Ir, nitride or carbide thereof, or chalcogenide materials or the like. The electrodes EL1 and EL2 may comprise an alloy material comprising more than one of the above metal and semiconductor elements.

[Variable Resistance Element]

The variable resistance element VR may comprise a material that may change, when applied with a voltage, its resistance via an electric field, a current, heat, a chemical energy or the like. The variable resistance element VR comprises, as a substrate, a film comprising silicon oxide $(SiO_x)$, for example. Specifically, the variable resistance element VR comprises a single layer film of silicon oxide $(SiO_x)$ or a stacked structure of silicon oxide $(SiO_x)$ and semiconductor or insulator. The semiconductor and insulator stacked on the silicon oxide $(SiO_x)$ comprise silicon (Si) and hafnium oxide $(HfO_x)$ or the like. As described below, the variable resistance element VR of this embodiment expresses different current-voltage characteristics with respect to the applied voltage depending on its state. This may be used to utilize the variable resistance element VR as a selection device.

The variable resistance element VR may comprise, in addition to the silicon oxide film, a silicon oxynitride film, polysilicon, amorphous silicon, germanium, silicon germanium, compound semiconductor, high permittivity insulating film, a single layer thereof, or a stacked film thereof.

In the memory cell MC, a positive voltage applied across the bit-line BL and the word-line WL moves metal ions from the electrode EL2 to the variable resistance element VR, thereby setting the memory cell MC to a low resistance state (on-state). Conversely, a negative voltage applied across the bit-line BL and the word-line WL moves metal ions from the variable resistance element VR to the electrode EL2, thereby setting the memory cell MC to a high resistance state (off-state). The write/erase to the memory cell MC is controlled by the voltage across the word-line WL and the bit-line BL.

[Memory Cell Array and Its Peripheral Circuit]

Figure 4:
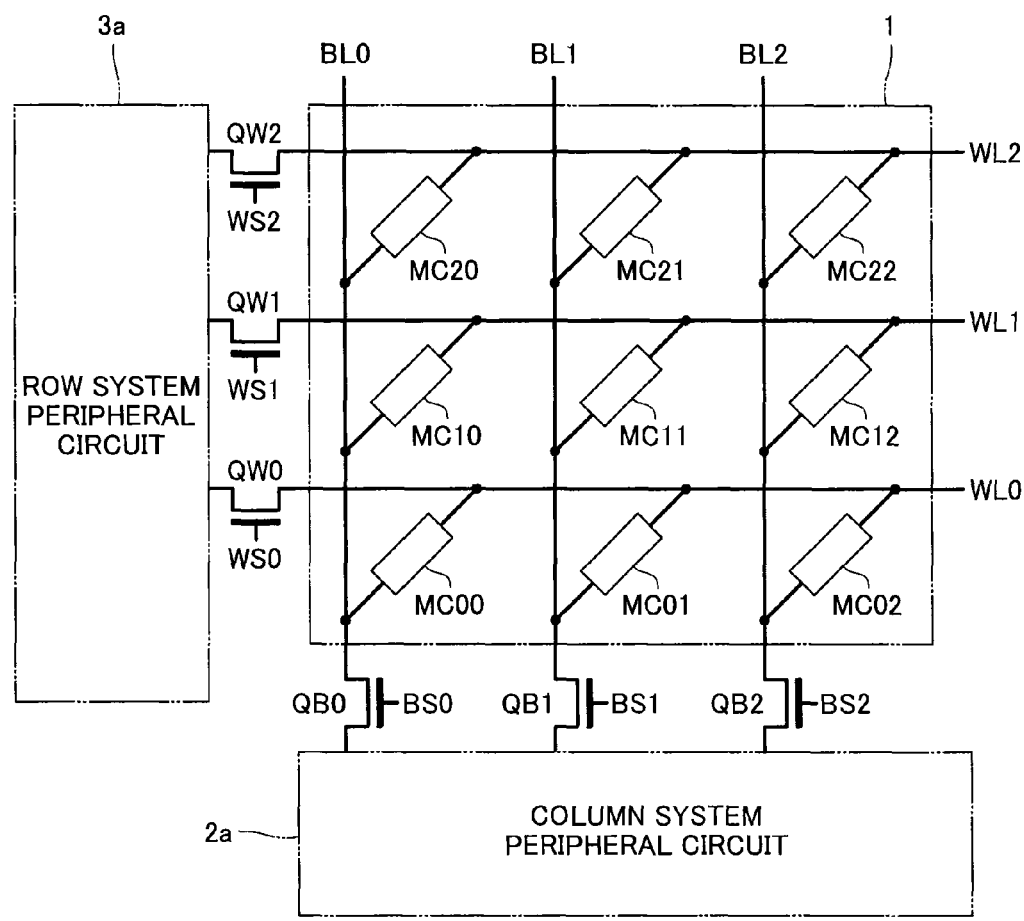
FIG. 4 is a circuit diagram of the memory cell array 1 and its peripheral circuit of the semiconductor memory device according to the first embodiment.

FIG. 4 is a circuit diagram of the memory cell array 1 and its peripheral circuit. Each bit-line BL has one end connected to, via a bit-line select transistor QBi (i=0 to 2), a column system peripheral circuit 2a, which is a portion of the column control circuit 2. In addition, each word-line WL has one end connected to, via a word-line select transistor QWi (i=0 to 2), a row system peripheral circuit 3a, which is a portion of the row control circuit 3. The bit-line select transistor QBi (i=0 to 2) has a gate electrode supplied with a bit-line selection signal BSi (i=0 to 2) to select each bit-line BL. The word-line select transistor QWi (i=0 to 2) has a gate electrode supplied with a word-line selection signal WSi (i=0 to 2) to select each word-line WL.

The column system peripheral circuit 2a and the row system peripheral circuit 3a supply the voltages necessary for the operation to, via the word-line select transistors QW and the bit-line select transistors QB, the bit-lines BL and the word-lines WL. The control using the word-line select transistors QW and the bit-line select transistors QB may control the write/erase of any memory cell MC in the memory cell array 1.

The voltage of each bit-line BL (for example the bit-line BL0) in the memory cell array 1 is controlled by the gate voltage of the bit-line select transistor QB0 and the output voltage of the decoder (the column system peripheral circuit 2a) connected to the drain of the bit-line select transistor QB0. A bit-line select transistor QBi (i=0 to 2) that controls the voltage of the bit-line BLi (i=0 to 2) has a drain and gate at least one of which is connected to a circuit different from that to which another bit-line select transistor QBi (i=0 to 2) is connected. Thus, the control of the column system peripheral circuit 2a may select any bit-line BLi (i=0 to 2), thereby selecting any memory cell MC.

The column system peripheral circuit 2a and the row system peripheral circuit 3a may be added with different functions necessary for the operation controls of the bit-lines BL and word-lines WL, respectively.

[Example Stacked Memory Cell Array]

Figure 5:
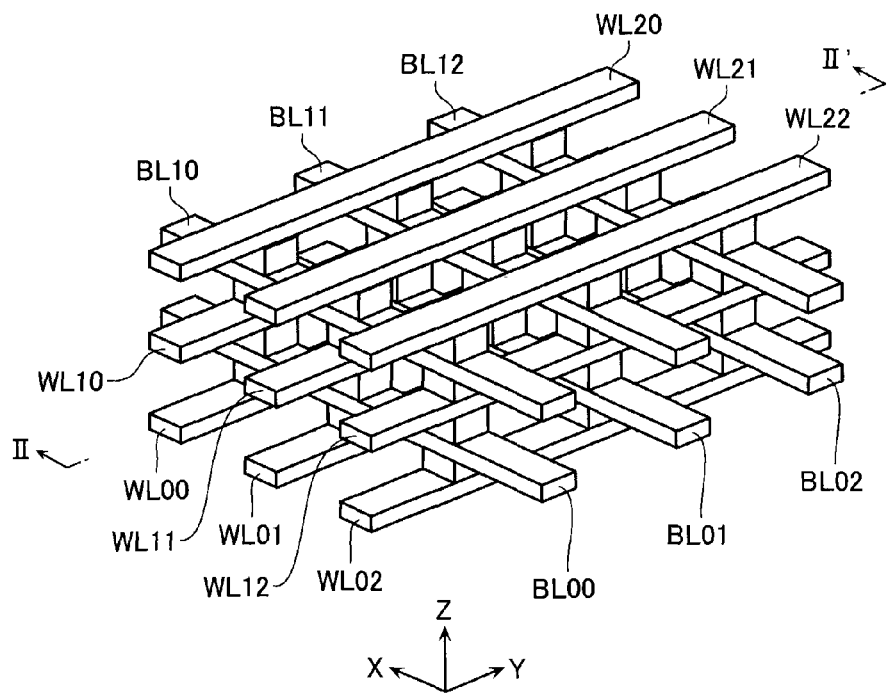
FIG. 5 and FIG. 6 each illustrate another example configuration of the memory cell array 1 of the semiconductor memory device according to the first embodiment.
Figure 6:
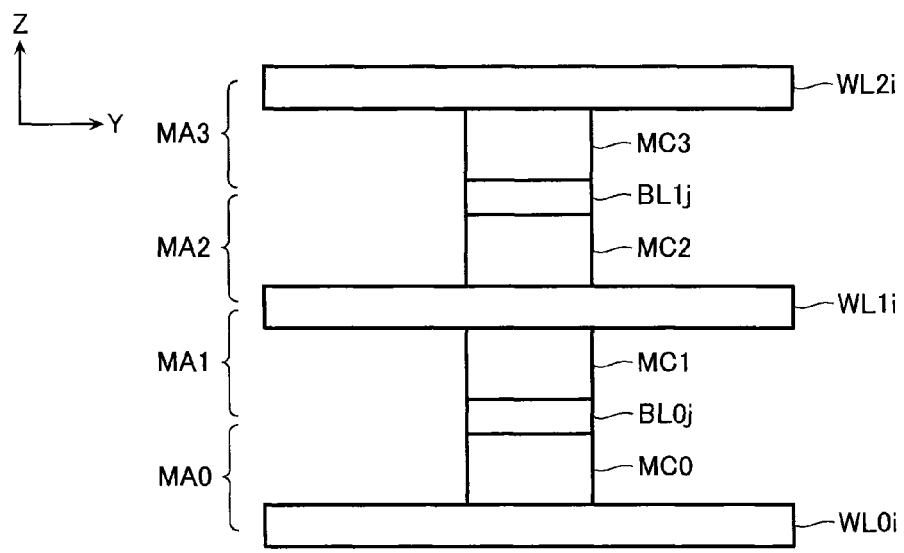

In addition, as shown in to FIG. 5, a three-dimensional structure in which the plural number of the above-described memory structures are stacked may be employed. FIG. 6 is a cross-sectional view showing the II-II' cross-section in FIG. 5. The shown example is a memory cell array of a four layer structure comprising cell array layers MA0 to MA3. A bit-line BL0j is shared by memory cells MC1 and MC0 on and under it. A word-line WL1i is shared by memory cells MC2 and MC1 on and under it. A bit-line BL1j is shared by memory cells MC3 and MC2 on and under it.

In addition, the repetition of the wiring line/cell/wiring line/cell may be replaced with the wiring line/cell/wiring line/interlayer dielectric film/wiring line/cell/wiring line, which has the interlayer dielectric film disposed between the cell array layers. Note that the memory cell array 1 may be divided into some memory cell groups MAT. The above column control circuit 2 and row control circuit 3 may be provided for each memory cell group MAT or provided for each cell array layer MA in each memory cell group MAT or be shared by the memory cell groups MAT or cell array layers MA. In addition, for the purpose of area reduction, more than one bit-line BL may share the column control circuit 2 and row control circuit 3.

[Configurations of Stacked Memory Cell Array, Select Transistor Layer, and Peripheral Circuit Layer]

Figure 7:
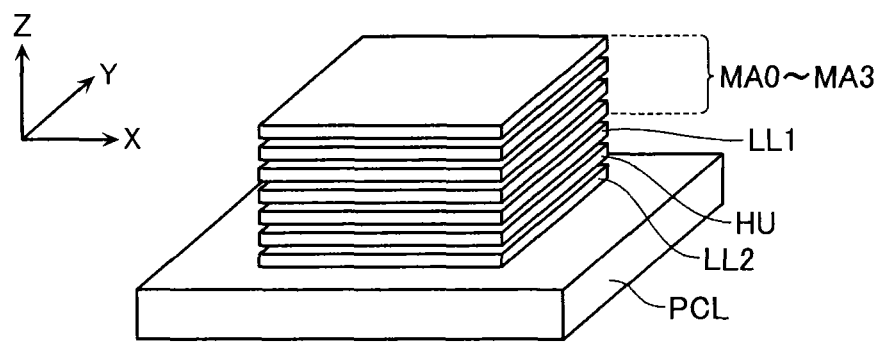
FIG. 7 is a perspective view showing the configuration of a stacked memory cell array, a select transistor layer, a wiring layer, and a peripheral circuit layer of the semiconductor memory device according to the first embodiment.

Next, a description is given of the configurations of the stacked memory cell array, the select transistor layer, and the peripheral circuit of the semiconductor memory device according to this embodiment. FIG. 7 is a perspective view showing the configurations of the stacked memory cell array, the select transistor layer, the wiring layer, and the peripheral circuit layer.

In this embodiment, it is assumed that the memory cell array 1 is configured as the stacked memory cell array described with reference to FIG. 5 and FIG. 6. With reference to FIG. 7, in this embodiment, four cell array layers of the cell array layers MA0 to MA3 are provided. Although FIG. 7 shows, for easy understanding, that the cell array layers MA0 to MA3 are separated, the cell array layers MA0 to MA3 are stacked via the bit-lines BL or the word-lines WL, as described with reference to FIG. 5 and FIG. 6.

The structure comprises, below the cell array layers MA0 to MA3 in the Z-direction, a wiring layer LL1, a select transistor layer HU having the select transistors QB and QW formed therein, and a wiring layer LL2. Below the wiring layer LL2, a peripheral circuit layer PCL is provided. The peripheral circuit layer PCL comprises the column system peripheral circuit 2*a* and the row system peripheral circuit 3*a*, which are formed on a semiconductor substrate.

In the embodiments described below, it is assumed that the bit-line select transistors QB are formed in the select transistor layer HU. The word-line select transistors QW may be formed in the peripheral circuit layer PCL on the silicon substrate or formed in the select transistor layer HU.

Figure 8:
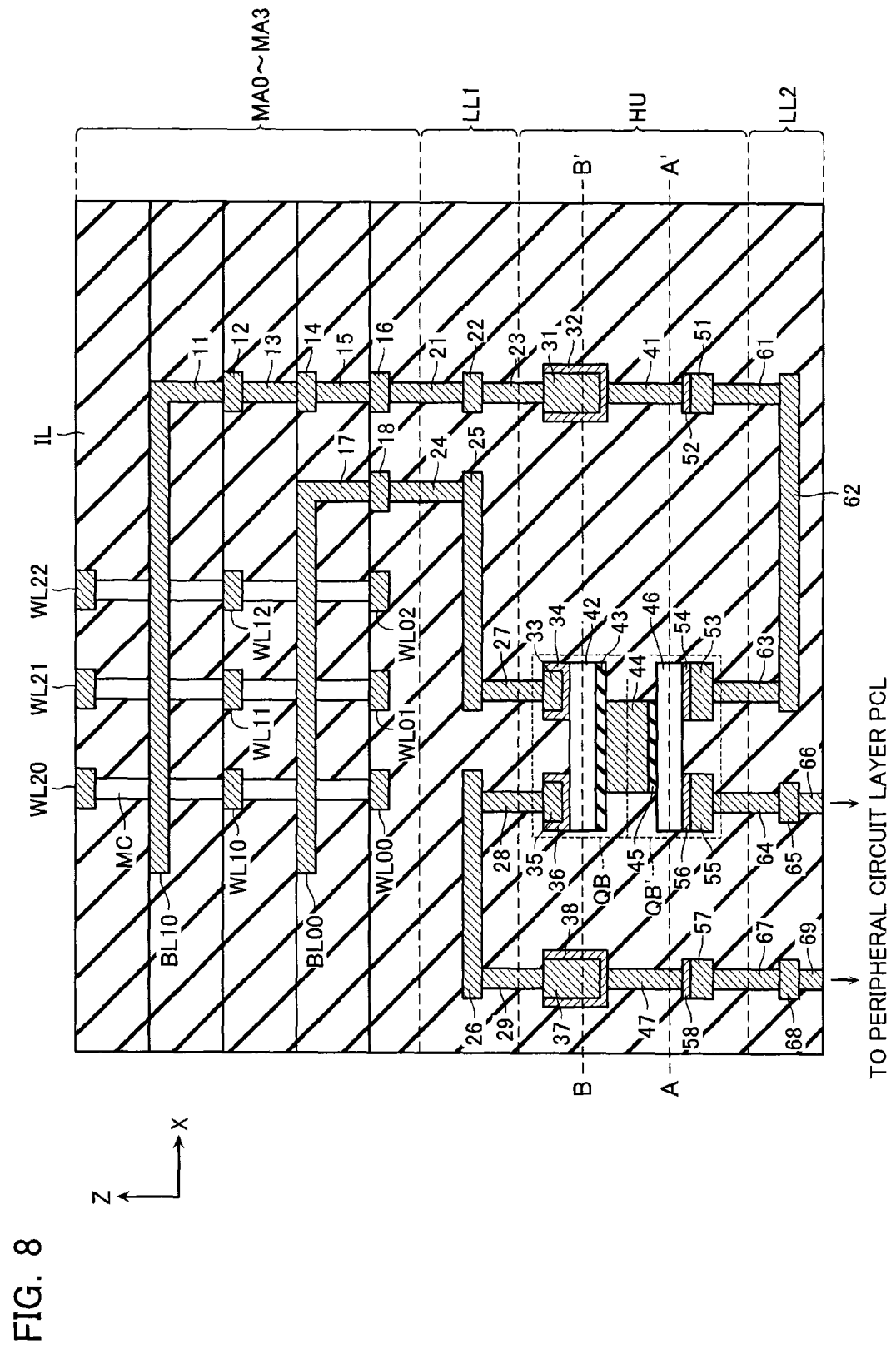
FIG. 8 is a cross-sectional view showing the configuration of the stacked memory cell array, the select transistor layer, and the wiring layer of the semiconductor memory device according to the first embodiment.

Next, a description is given of the detailed configurations of the cell array layers MA0 to MA3, the select transistor layer HU, and the wiring layers LL1 and LL2 thus formed. FIG. 8 is an X-direction cross-sectional view of the cell array layers MA0 to MA3, the select transistor layer HU, and the wiring layers LL1 and LL2 shown in FIG. 7.

With reference to FIG. 8, the cell array layers MA0 to MA3 are formed, each cell array layer comprising a stack of the memory cells MC via the bit-lines BL or the word-lines WL. In addition, the select transistor layer HU has select transistors QB and QB' formed therein. The configurations of the select transistors QB and QB' will be described below in more detail.

The cell array layers MA0 and MA1 comprise a bit-line BL00. The bit-line BL00 is connected to, via vias 17, 24, and 27, a wiring line 25, and a pad 18, a source electrode 33 of the select transistor QB. The cell array layers MA2 and MA3 comprise a bit-line BL10. The bit-line BL10 is connected to, via vias 11, 13, 15, 21, 23, 41, 61, and 63, a wiring line 62, and pads 12, 14, 16, 22, 31, and 51, a source electrode 53 of the select transistor QB'.

The select transistor QB comprises a drain electrode 35. The drain electrode 35 is connected to, via vias 28, 29, 47, 67, and 69, a wiring line 26, and pads 37, 57, and 68, a circuit such as a decoder provided in the peripheral circuit layer PCL. The select transistor QB' comprises a drain electrode 55. The drain electrode 55 is connected to, via vias 64 and 66 and a pad 65, a circuit such as a decoder provided in the peripheral circuit layer PCL. Here, the select transistors QB and QB' are connected to different circuits in the peripheral circuit layer PCL.

[Structure of Select Transistor]

Next, the structures of the select transistors QB and QB' will be described in more detail. The select transistor QB comprises the source electrode 33 and a barrier metal layer 34, and the drain electrode 35 and a barrier metal layer 36. In addition, the select transistor QB comprises a polysilicon layer 42. Then, the select transistor QB comprises a gate oxide film 43 and a gate electrode 44. The polysilicon layer 42 functions as the channel region of the select transistor QB. The polysilicon layer 42 does not comprise an impurity diffusion layer. The overlap regions between the source/drain electrodes 33 and 35 and the gate electrode 44 function as the source/drain regions, respectively.

The select transistor QB' comprises the source electrode 53 and a barrier metal layer 54, and the drain electrode 55 and a barrier metal layer 56. In addition, the select transistor QB' comprises a polysilicon layer 46. Then, the select transistor QB' comprises a gate oxide film 45 and the gate electrode 44. The polysilicon layer 46 functions as the channel region of the select transistor QB'. The polysilicon layer 46 does not comprise an impurity diffusion layer. The overlap regions between the source/drain electrodes 53 and 55 and the gate electrode 44 function as the source/drain regions, respectively.

Here, the select transistor QB and the select transistor QB' are formed to be stacked in a direction (Z-direction) perpendicular to the semiconductor substrate bearing the peripheral circuit layer PCL. In addition, the select transistors QB and QB' share one gate electrode 44. The select transistors QB and QB' are formed to have a symmetrical shape about the gate electrode 44.

The pads 31, 51, 37, and 57 have respective barrier metal layers 32, 52, 38, and 58 provided thereto. As described in the manufacturing method described below, the barrier metal layers 32, 52, 38, and 58 are formed at the same time as the barrier metal layers 34, 54, 36, and 56 of the source electrodes 33 and 53 and the drain electrodes 35 and 55 of the select transistors QB and QB'.

Figure 9:
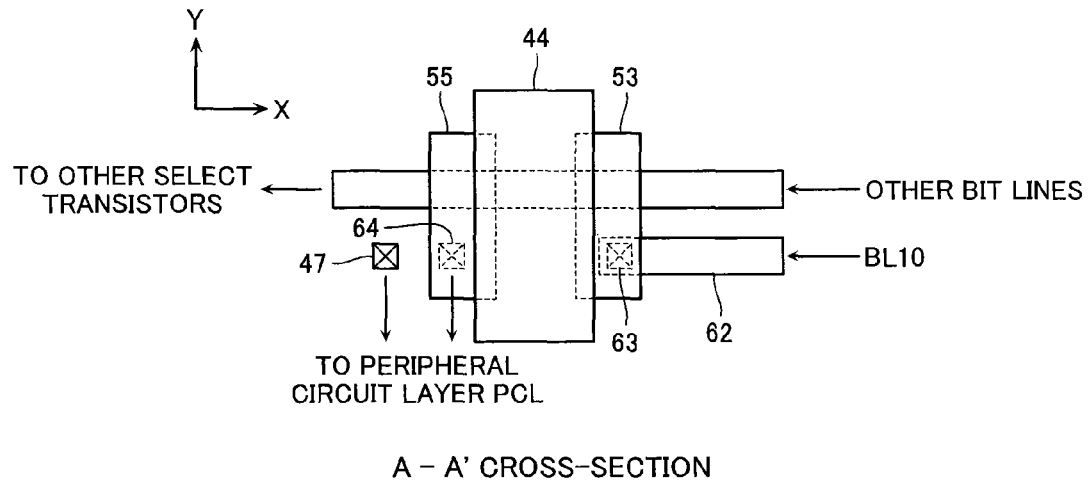
FIG. 9 is a cross-sectional view showing the configuration of the select transistor layer and the wiring layer of the semiconductor memory device according to the first embodiment.
Figure 10:
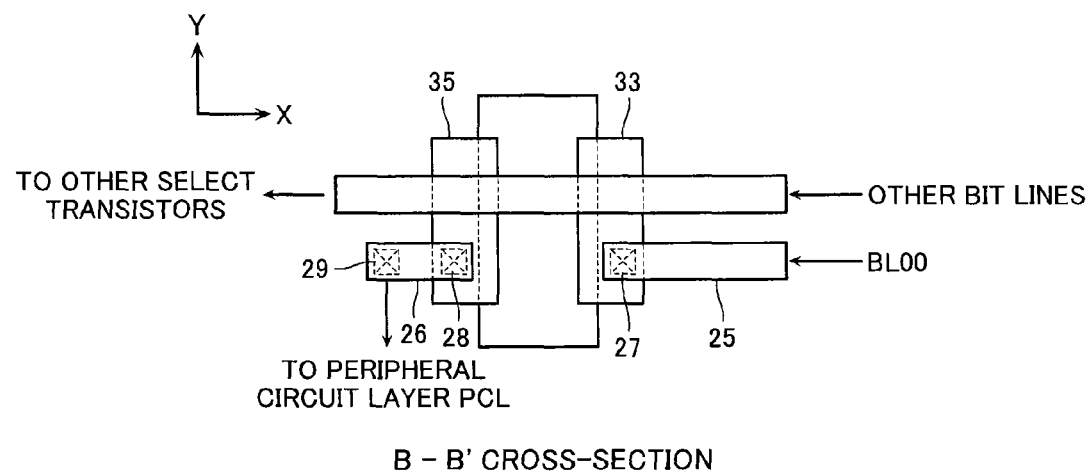
FIG. 10 is a cross-sectional view showing the configuration of the select transistor layer and the wiring layer of the semiconductor memory device according to the first embodiment.

FIG. 9 and FIG. 10 are top-down views of the cross-sections of the select transistor layer HU cut along the A-A' line and the B-B' line shown in FIG. 8 in a direction horizontal to the semiconductor substrate. FIG. 9 and FIG. 10 show, in addition to the configurations in the cross-sections along the A-A' line and the B-B' line, a portion of other configurations of the select transistors QB and QB'.

With reference to FIG. 9, the select transistor QB' comprises the gate electrode 44, the source electrode 53, and the drain electrode 55. The source electrode 53 and the drain electrode 55 are provided below the gate electrode 44 (the polysilicon layer 46 is not shown). Here, wiring lines extending from other bit-lines BL not shown in FIG. 8 to FIG. 10 extend to other select transistors. Those wiring lines may be provided, together with the wiring line 62, in the wiring layer LL2.

In addition, with reference to FIG. 10, the select transistor QB comprises the gate electrode 44, the source electrode 33, and the drain electrode 35. The source electrode 33 and the drain electrode 35 are provided above the gate electrode 44 (the polysilicon layer 42 is not shown). Here, wiring lines extending from other bit-lines BL not shown in FIG. 8 to FIG. 10 extend to other select transistors. Those wiring lines may be provided, together with the wiring line 25, in the wiring layer LL1.

In the semiconductor memory device described with reference to FIG. 8 to FIG. 10, the channels of the select transistors QB and QB' formed in the select transistor layer HU may comprise, in addition to the polysilicon layers 42 and 46, single crystal silicon, amorphous silicon, germanium, silicon germanium, compound semiconductor, oxide semiconductor (such as InGaZnO) or the like. In addition, the gate-insulating film of the select transistors QB and QB' may comprise a single layer of a silicon oxide film, a silicon oxynitride film, and a high permittivity insulating film, or a stacked structure thereof or the like. Then, the gate electrodes of the select transistors QB and QB' may comprise polysilicon, metal silicide, TiN, W, TaC, or a stacked film of polysilicon and metal, or the like.

The word-lines WL, the bit-lines BL, the electrodes of the select transistors QB and QB', the vias, the wiring lines, the pads or the like may be made of materials comprising metal such as tungsten, a single layer of titanium nitride, or a stacked structure thereof. The materials of the barrier metal layers 34, 36, 54, and 56 of the select transistors QB and QB' may comprise a metal such as titanium nitride.

The memory cell MC formed in a columnar shape had a width of typically about 5 nm to 100 nm. The variable resistance element VR and the electrodes EL1 and EL2 of the memory cell MC have a thickness of typically about 1 nm to 50 nm. The gate lengths of the select transistors QB and QB' (the X-direction distances between the source electrodes 33 and 53 and the drain electrodes 35 and 55, respectively) are typically about 50 nm to 1 µm. The gate width (the Y-direction width of the gate electrode 44) is typically about 5 nm to 1 µm. The film thicknesses of the gate oxide films 43 and 45 are typically about 1 nm to 10 nm. The film thicknesses of the polysilicon layers 42 and 46 are typically about 3 nm to 50 nm.

[Manufacturing Method]

Next, a method of manufacturing the semiconductor memory device according to this embodiment will be described. FIG. 11 to FIG. 20 are cross-sectional views illustrating the method of manufacturing the semiconductor memory device according to this embodiment. FIG. 11 to FIG. 20 show cross-sections corresponding to the cross-section shown in FIG. 8.

Figure 11:
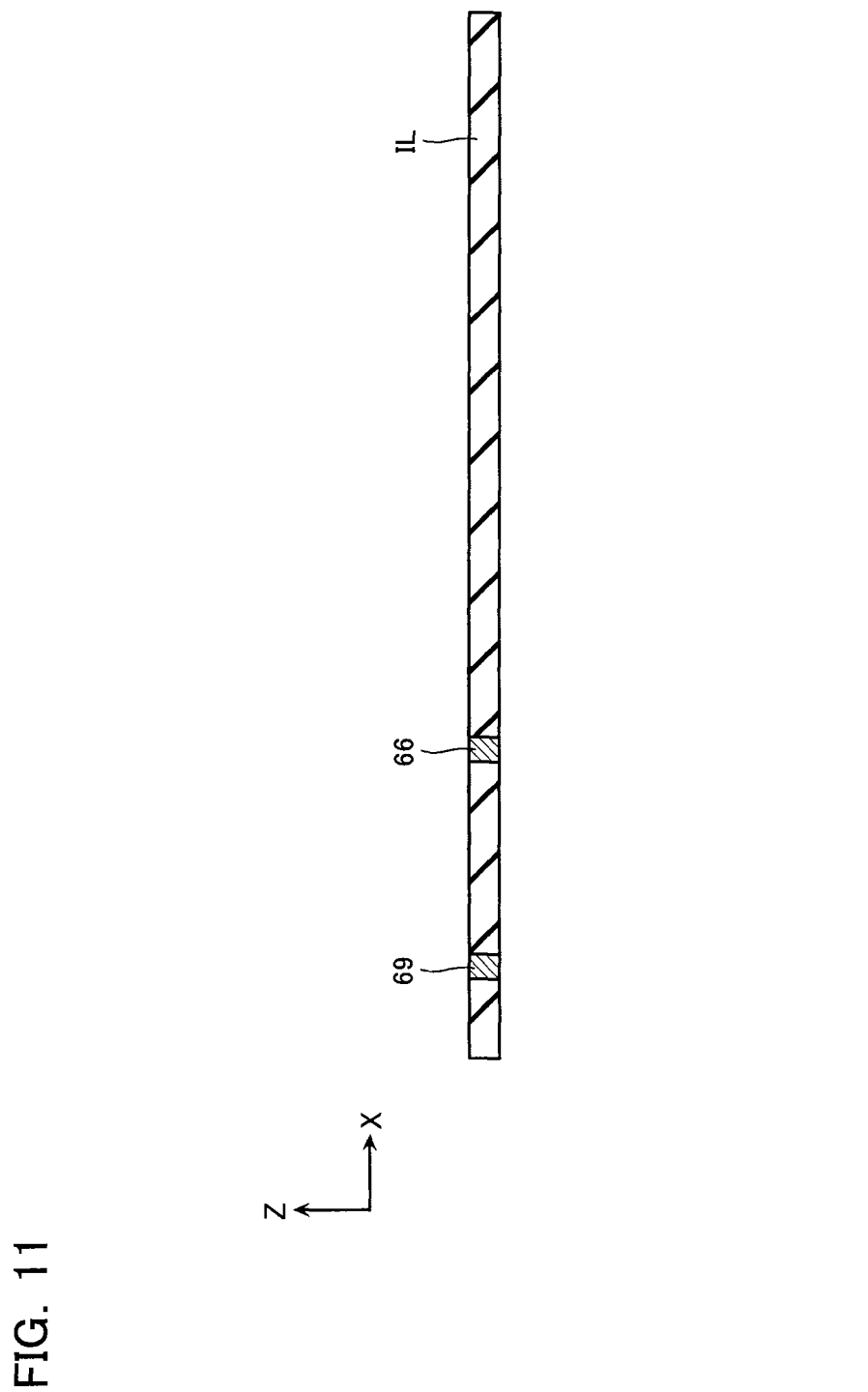
FIG. 11 to FIG. 20 each illustrate a cross-sectional view showing a method of manufacturing the select transistor layer and the wiring layer of the semiconductor memory device according to the first embodiment.

First, with reference to FIG. 11, an interlayer dielectric film IL is deposited on the peripheral circuit layer PCL. The peripheral circuit layer PCL bears the column system peripheral circuit 2a, the row system peripheral circuit 3a, and other peripheral circuits. Then, via holes are patterned, and the via holes are filled with a metal film (for example, tungsten). Then the structure is subjected to the chemical mechanical polishing (CMP) to form the vias 66 and 69.

Figure 12:
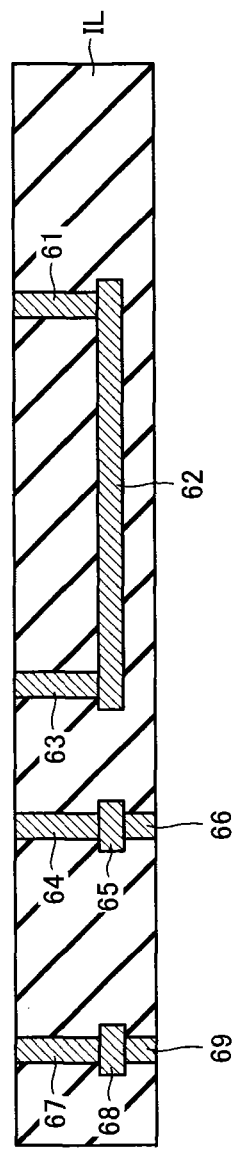

Next, with reference to FIG. 12, the deposition of an interlayer dielectric film IL, the patterning of via holes or wiring patterns, the filling of a metal film (for example, tungsten) in the via holes, and the CMP are repeated twice to form the wiring line 62, the pads 65 and 68, and the vias 61, 63, 64, and 67.

Figure 13:
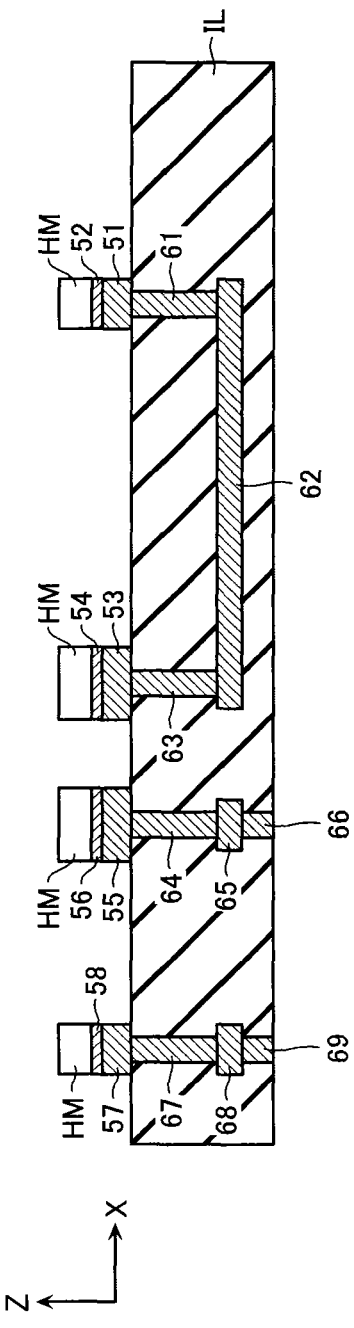

Next, with reference to FIG. 13, a metal film, a barrier metal film, and a hard mask HM are deposited and then patterned to form the pads 51 and 57, the source electrode 53, the drain electrode 56, and the barrier metal layers 52, 54, 55, and 58. The hard mask HM may comprise, for example, a silicon nitride film.

Figure 14:
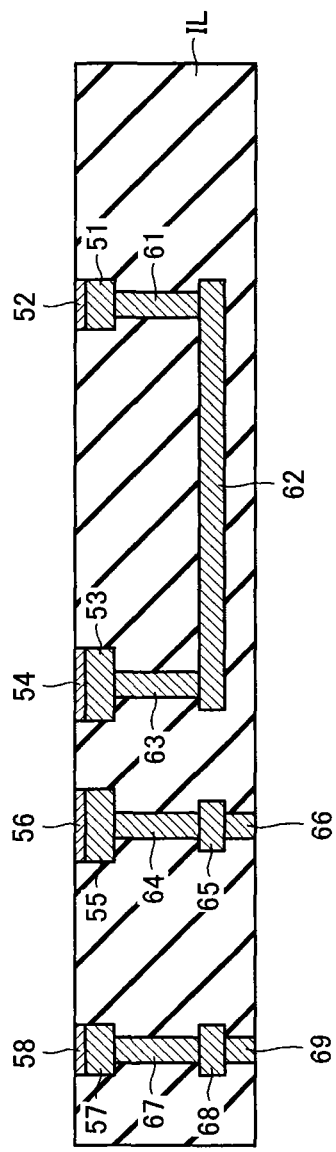

Next, with reference to FIG. 14, an interlayer dielectric film IL is deposited. Then the structure is subjected to the CMP using the hard mask HM as a stopper. Then, the hard mask HM is removed by wet etching and the interlayer dielectric film IL is etched back.

Figure 15:
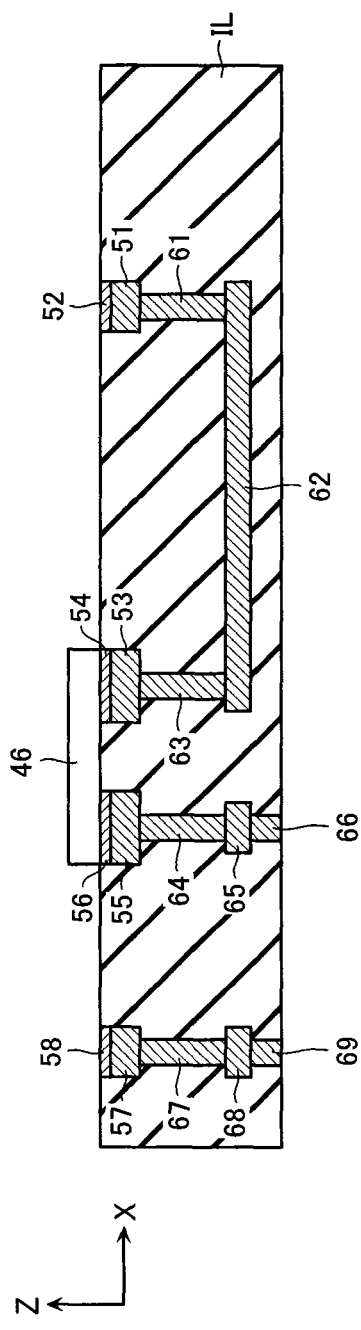

Next, with reference to FIG. 15, amorphous silicon is deposited and then the structure is subjected to the crystallization annealing. Then the structure is patterned to form the polysilicon layer 46. Here, the crystallization annealing may be performed, for example, at a temperature of 500 to 1100° C., in a nitrogen atmosphere, and for several microseconds to several tens of hours. Note that the crystallization annealing may not be performed at this stage and instead may be performed after the entire select transistor layer HU is formed.

Figure 16:
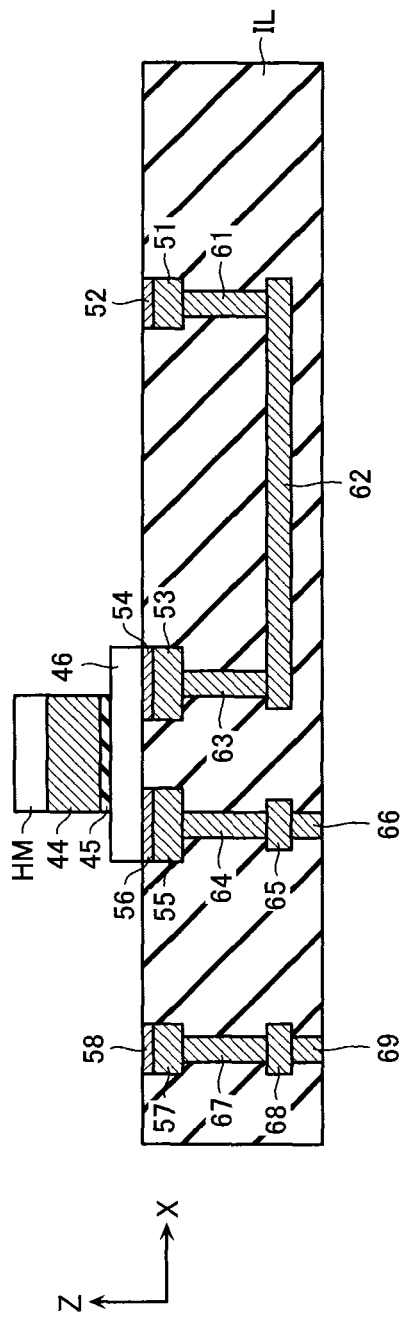

Next, with reference to FIG. 16, a silicon oxide film, a metal film (for example, tungsten), and a hard mask HM are deposited and then patterned to form the gate oxide film 45 and the gate electrode 44.

Figure 17:
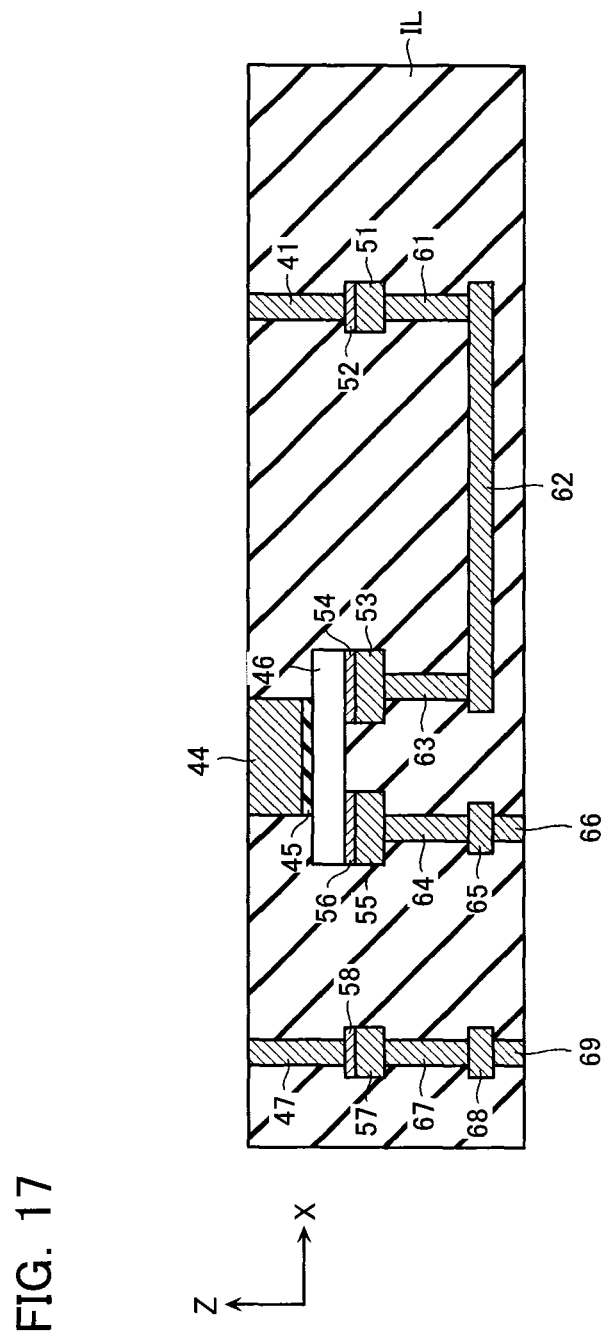

Next, with reference to FIG. 17, an interlayer dielectric film IL is deposited. Then the structure is subjected to the CMP using the hard mask HM as a stopper. Then, the hard mask HM is removed by wet etching and the interlayer dielectric film IL is etched back. Then, via holes are patterned and the via holes are filled with a metal film (for example, tungsten). Then the structure is subjected to the CMP to form the vias 41 and 47.

Figure 18:
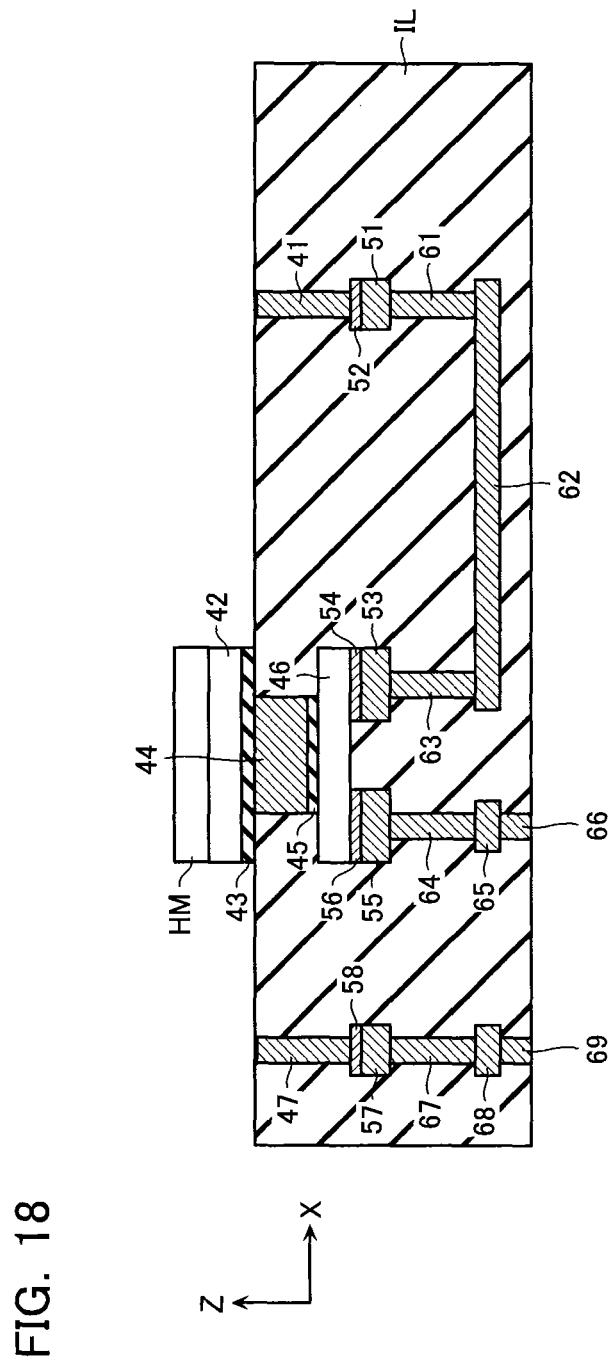

Next, with reference to FIG. 18, a silicon oxide film, amorphous silicon, and a hard mask HM are deposited and then the structure is subjected to the crystallization annealing. Then the structure is patterned to form the gate oxide film 43 and the polysilicon layer 42. Here, the crystallization annealing may be performed, for example, at a temperature of 500 to 1100° C., in a nitrogen atmosphere, and for some ms to some ten hours. Note that the crystallization annealing may not be performed at this stage and instead may be performed after the entire select transistor layer HU is formed.

Figure 19:
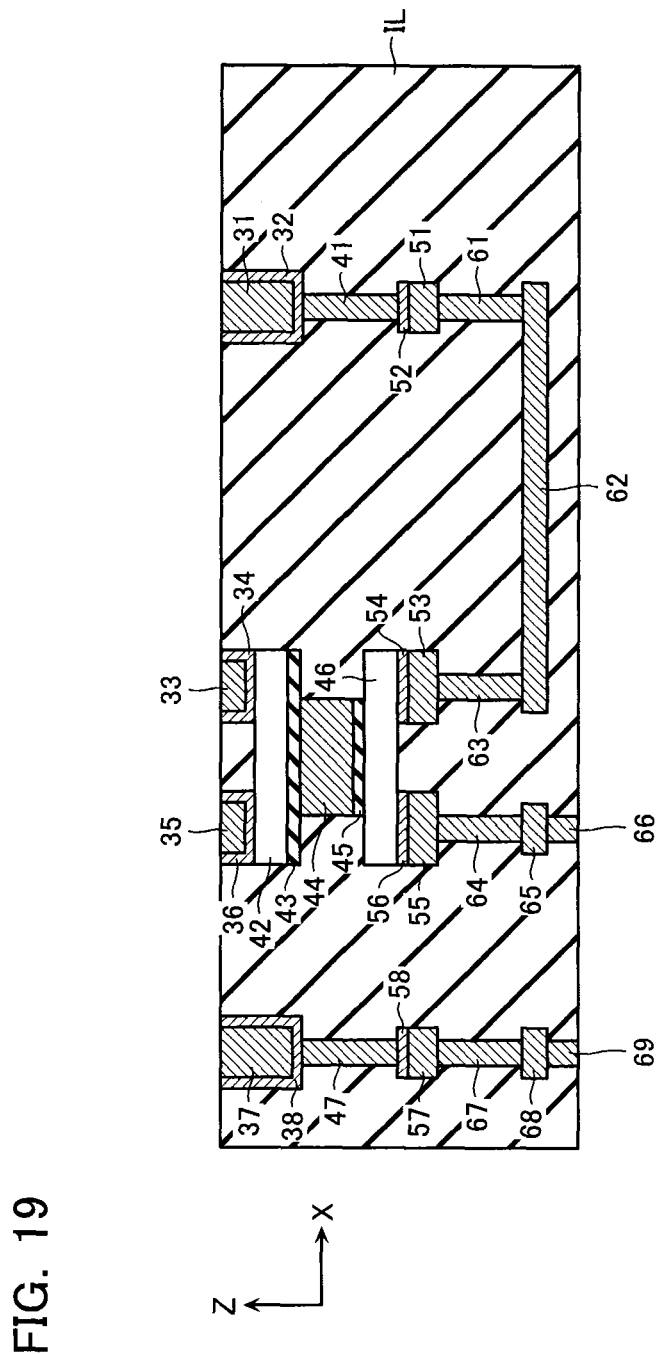

Next, with reference to FIG. 19, an interlayer dielectric film IL is deposited. Then the structure is subjected to the CMP using the hard mask HM as a stopper. Then, the hard mask HM is removed by wet etching and the interlayer dielectric film IL is etched back. Then, further an interlayer dielectric film IL is deposited and then via holes are patterned. Then, the via holes are filled with a barrier metal film (for example, titanium nitride) and a metal film (for example, tungsten). Then the structure is subjected to the CMP to form the pads 31 and 37, the source electrode 33, the drain electrode 35, and the barrier metal layers 32, 36, 35, and 38.

Figure 20:
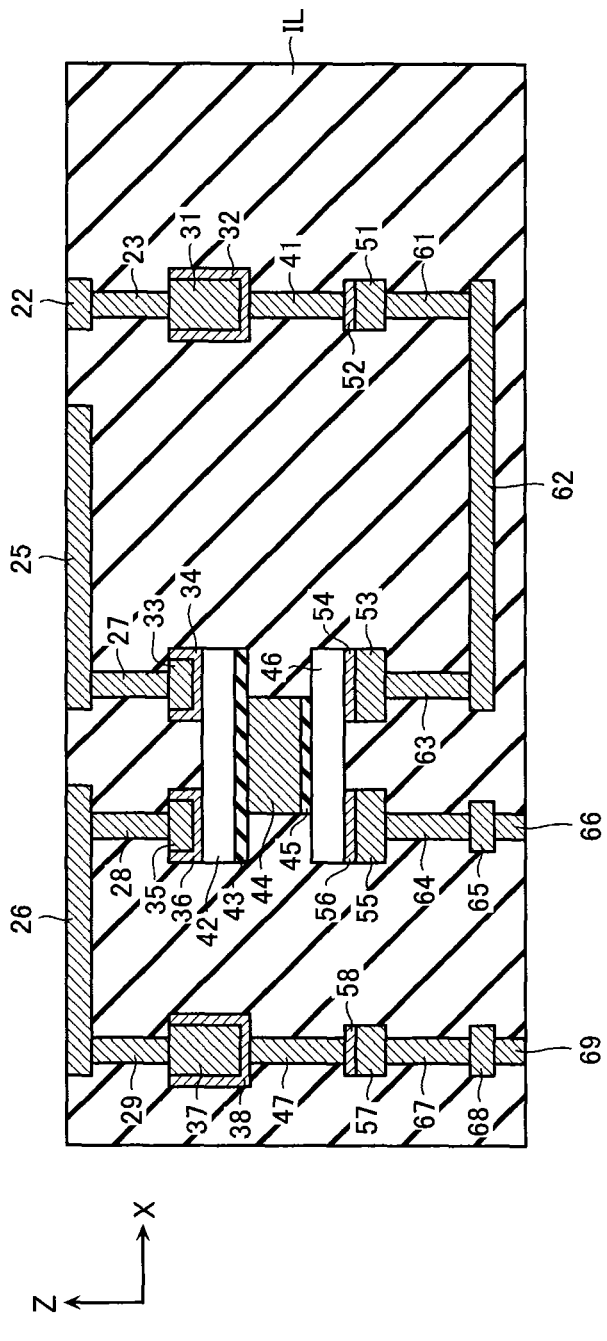

Next, with reference to FIG. 20, the deposition of an interlayer dielectric film IL, the patterning of via holes or wiring patterns, the filling of a metal film (for example, tungsten) in the via holes, and the CMP are repeated twice to form the wiring lines 25 and 26, the pad 22, and the vias 23, 27, 28, and 29.

Then, a known method may be used to form the upper-layer vias, pads, and cell array layers MA0 to MA3, thereby manufacturing the semiconductor memory device according to this embodiment shown in FIG. 8.

[Effects]

Figure 21:
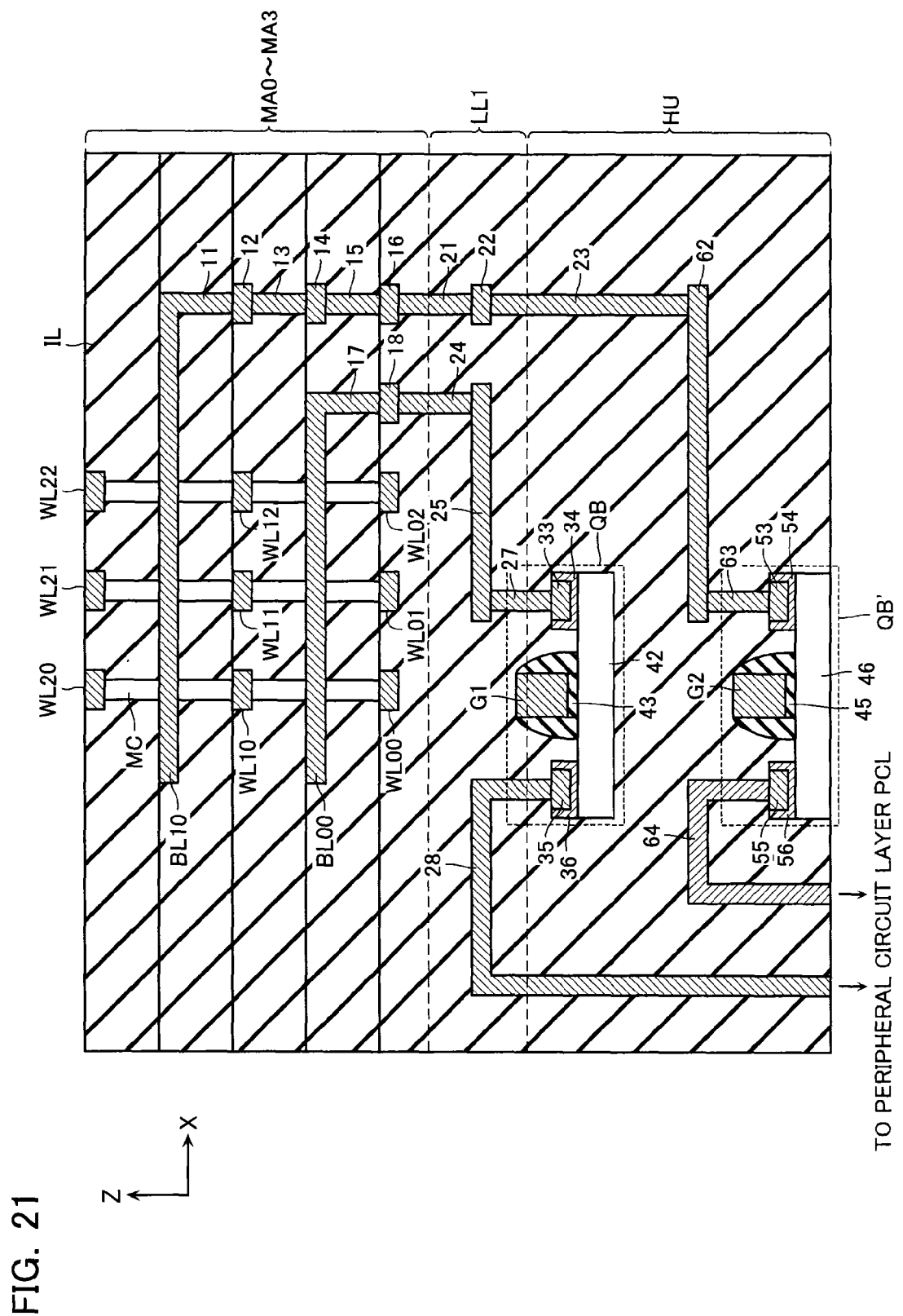
FIG. 21 is a cross-sectional view showing the configuration of a stacked memory cell array, a select transistor layer, a wiring layer, and a peripheral circuit layer of the semiconductor memory device according to a comparative example.

A description is given of the effects of the stacked memory cell array 1, the select transistor layer HU, the wiring layers LL1 and LL2, and the peripheral circuit layer PCL thus configured according to this embodiment, with reference to a comparative example. FIG. 21 is a cross-sectional view showing the configuration of a semiconductor memory device according to the comparative example. FIG. 21 shows a cross-section corresponding to that in FIG. 8.

With reference to FIG. 21, the semiconductor memory device of the comparative example is formed to comprise a stack of two select transistors QB and QB' in the Z-direction. Note, however, that the two select transistors QB and QB' are individually formed and the two gate electrodes provided in the select transistors QB and QB' are separated unlike those in the above embodiment.

In the semiconductor memory device according to the comparative example shown in FIG. 21, the bit-line BL00 provided in the cell array layers MA0 and MA1 is connected to, via the vias 17, 24, and 27, the wiring line 25, the pad 18, the source electrode 33 of the select transistor QB. The bit-line BL10 provided in the cell array layers MA2 and MA3 is connected to, via the vias 11, 13, 15, 21, 23, and 63, the wiring line 62, the pads 12, 14, 16, and 22, the source electrode 53 of the select transistor QB'.

The drain electrode 35 of the select transistor QB is connected to, via the via 28, a circuit such as a decoder provided in the peripheral circuit layer PCL. The drain electrode 55 of the select transistor QB' is connected to, via the via 64, a circuit such as a decoder provided in the peripheral circuit layer PCL. Here, the select transistors QB and QB' are connected to different circuits in the peripheral circuit layer PCL.

The select transistor QB comprises the source electrode 33 and the barrier metal layer 34, and the drain electrode 35 and the barrier metal layer 36. In addition, the select transistor QB comprises the polysilicon layer 42. Then, the select transistor QB comprises the gate oxide film 43 and a gate electrode G1.

The select transistor QB' comprises the source electrode 53 and the barrier metal layer 54, and the drain electrode 55 and the barrier metal layer 56. In addition, the select transistor QB' comprises the polysilicon layer 46. Then, the select transistor QB' comprises the gate oxide film 45 and a gate electrode G2.

Here, although the select transistors QB and QB' of the comparative example are configured to be stacked in the Z-direction, the select transistors QB and QB' are individually formed. The select transistors QB and QB' are configured to have different respective gate electrodes G1 and G2.

In the semiconductor memory device according to the comparative example shown in FIG. 21, the voltage applied to the gate electrode G2 of the select transistor QB' may affect the potential of the channel region of the polysilicon layer 42 of the select transistor QB. The operation situation of the select transistor QB' may vary the threshold voltage and the drain current of the select transistor QB.

Meanwhile, in the semiconductor memory device of this embodiment shown in FIG. 8, the select transistors QB and QB' share the single gate electrode 44. In this case, the voltage applied to the gate electrode 44 is the voltage necessary for the operations of both select transistors QB and QB'. This voltage does not affect the threshold voltage and the drain current of the select transistors QB and QB'. As a result, the semiconductor memory device of this embodiment shown in FIG. 8 may achieve the stable operations of the select transistors QB and QB'.

In addition, the select transistors QB and QB' are connected to different circuits in the peripheral circuit layer PCL. Therefore, even if the gate electrode 44 is applied with a voltage to activate the select transistors QB and QB', the control of the different circuits in the peripheral circuit layer PCL may control the bit-lines BL00 and BL10 separately.

In addition, the method of manufacturing the semiconductor memory device according to this embodiment shown in FIG. 11 to FIG. 20 manufactures the semiconductor memory device to allow the select transistors QB and QB' to share one gate electrode 44. Therefore, the method of manufacturing the semiconductor memory device according to this embodiment may reduce the number of manufacturing processes of the gate electrodes and manufacturing processes of the wiring lines connected to the gate electrodes, compared to forming the different gate electrodes G1 and G2 in the two select transistors QB and QB' as in the comparative example shown in FIG. 21. This may reduce the cost of the manufacturing processes.

In the method of manufacturing the semiconductor memory device according to this embodiment, the diffusion layers of the select transistors QB and QB' are not formed, and the overlap regions between the source/drain electrodes 33, 53, 35, and 55 and the gate electrode 44 function as the source/drain regions. Therefore, the high temperature process necessary for the activation of the diffusion layer is unnecessary. This may reduce the degradation of the characteristics of the CMOS circuits including the decoder formed in the underlying peripheral circuit layer PCL.

Second Embodiment

Next, with reference to FIG. 22, a second embodiment will be described. The entire configuration of a semiconductor memory device according to the second embodiment is similar to that in the first embodiment and thus its detailed description is omitted. In addition, like elements as those in the first embodiment are designated by like reference numerals, and repeated description thereof is omitted here.

In the semiconductor memory device according to this embodiment, the upper-layer select transistor QB and the lower-layer select transistor QB' are formed with transistors of different structures unlike the semiconductor memory device according to the first embodiment. With reference to FIG. 22, the configuration of the semiconductor memory device according to this embodiment will be described below.

[Structure of Select Transistor]

Again, in this embodiment, the select transistors QB and QB' are formed to be stacked in the Z-direction and share one gate electrode 44. The select transistors QB and QB' are configured to have a symmetrical shape about the gate electrode 44.

Here, in this embodiment, the upper-layer select transistor QB comprises an impurity diffusion layer 39. The impurity diffusion layer 39 comprises the polysilicon layer 42 implanted with an impurity (for example, fluorine). Meanwhile, in the lower-layer select transistor QB', the polysilicon layer 46 is not implanted with an impurity. The polysilicon layer 42 of the select transistor QB may be implanted with an impurity comprising, in addition to fluorine, germanium, silicon, or the like. These impurities may have a concentration of about, $1 \times 10^{17}$ cm$^{-3}$ to $1 \times 10^{20}$ cm$^{-3}$.

[Manufacturing Method]

Next, a method of manufacturing the semiconductor memory device according to this embodiment will be described. FIG. 23 to FIG. 26 are cross-sectional views showing the method of manufacturing the semiconductor memory device according to this embodiment.

Figure 23:
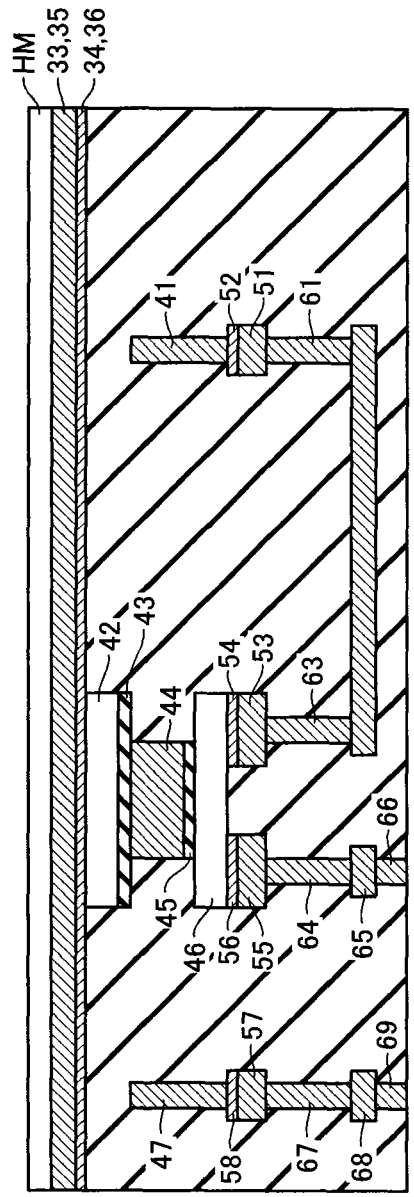
FIG. 23 to FIG. 26 each illustrate a cross-sectional view showing a method of manufacturing the select transistor layer and the wiring layer of the semiconductor memory device according to the second embodiment.

The method of manufacturing the semiconductor memory device according to this embodiment is similar to, until the step shown in FIG. 18, the method of manufacturing the semiconductor memory device according to the first embodiment. FIG. 23 is a cross-sectional view showing the method of manufacturing the semiconductor memory device after the step in FIG. 18. After the step shown in FIG. 18, an interlayer dielectric film IL is deposited and then the structure is subjected to the CMP using the hard mask HM as a stopper. Then, the hard mask HM is removed by wet etching and the interlayer dielectric film IL is etched back. Then, a barrier metal film (for example, titanium nitride), a metal film (for example, tungsten), and a hard mask HM are sequentially deposited. This provides the structure shown in FIG. 23.

Figure 24:
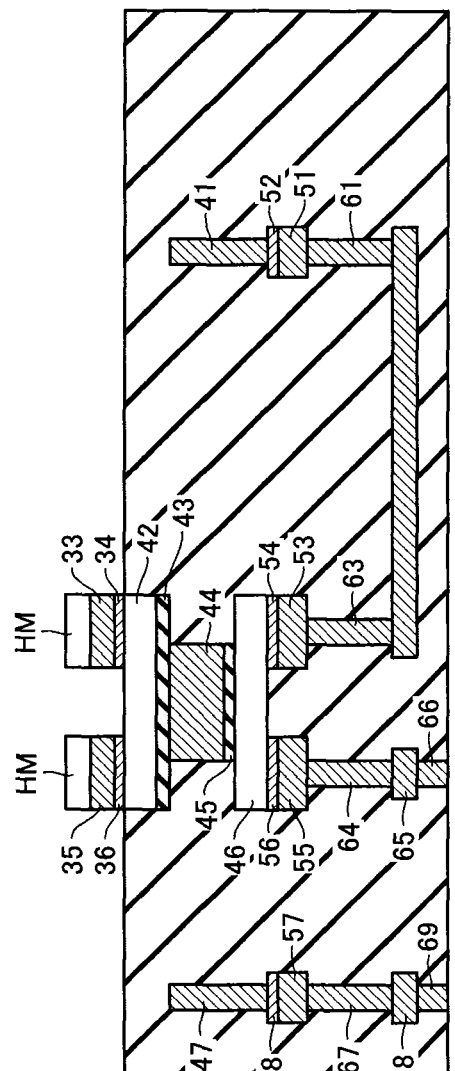

Next, with reference to FIG. 24, a patterning process is conducted to form the source electrode 33, the drain electrode 35, and the barrier metal layers 34 and 36.

Figure 25:
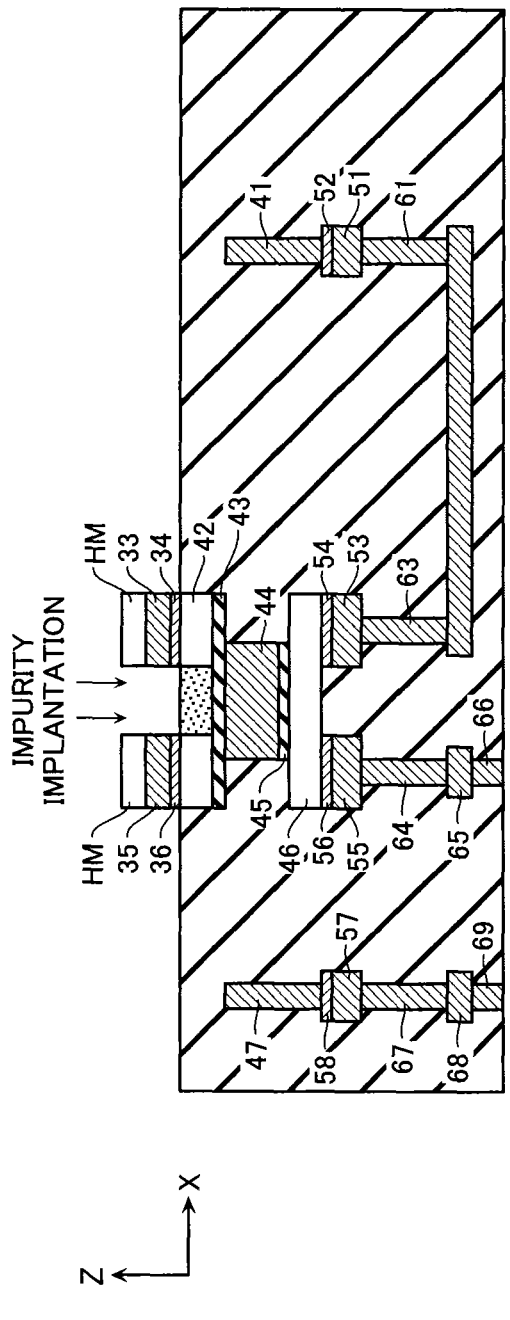

Next, with reference to FIG. 25, using the source electrode 33, the drain electrode 35, and the barrier metal layers 34 and 36 as the masks, the polysilicon layer 42 is implanted with an impurity (for example, fluorine). Then, a thermal process is conducted to activate the implanted impurity.

Figure 26:
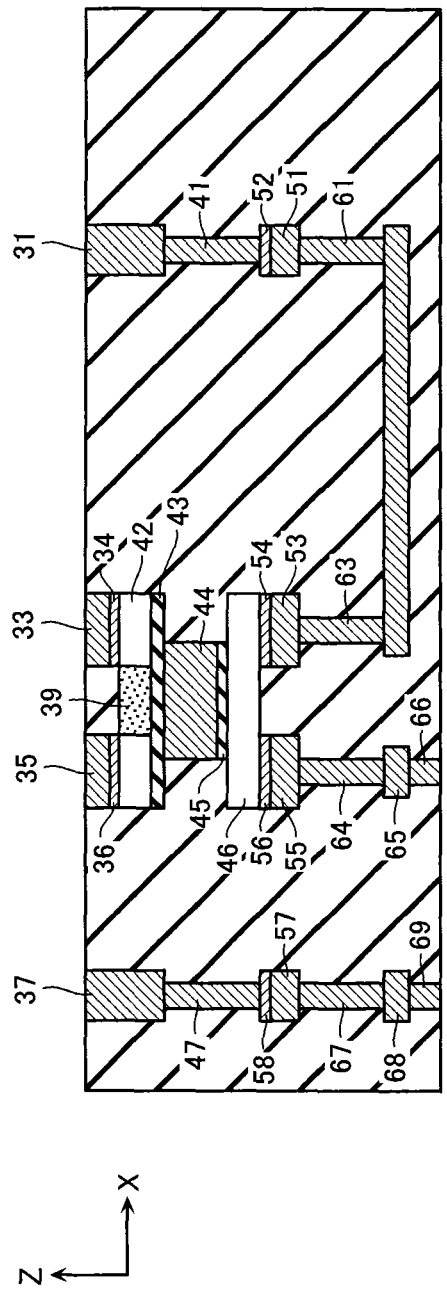

Next, with reference to FIG. 26, an interlayer dielectric film IL is deposited and then the structure is subjected to the CMP. Then, via holes are patterned. The via holes are filled with a metal film (for example, tungsten) and then the structure is subjected to the CMP to form the pads 31 and 37.

Figure 22:
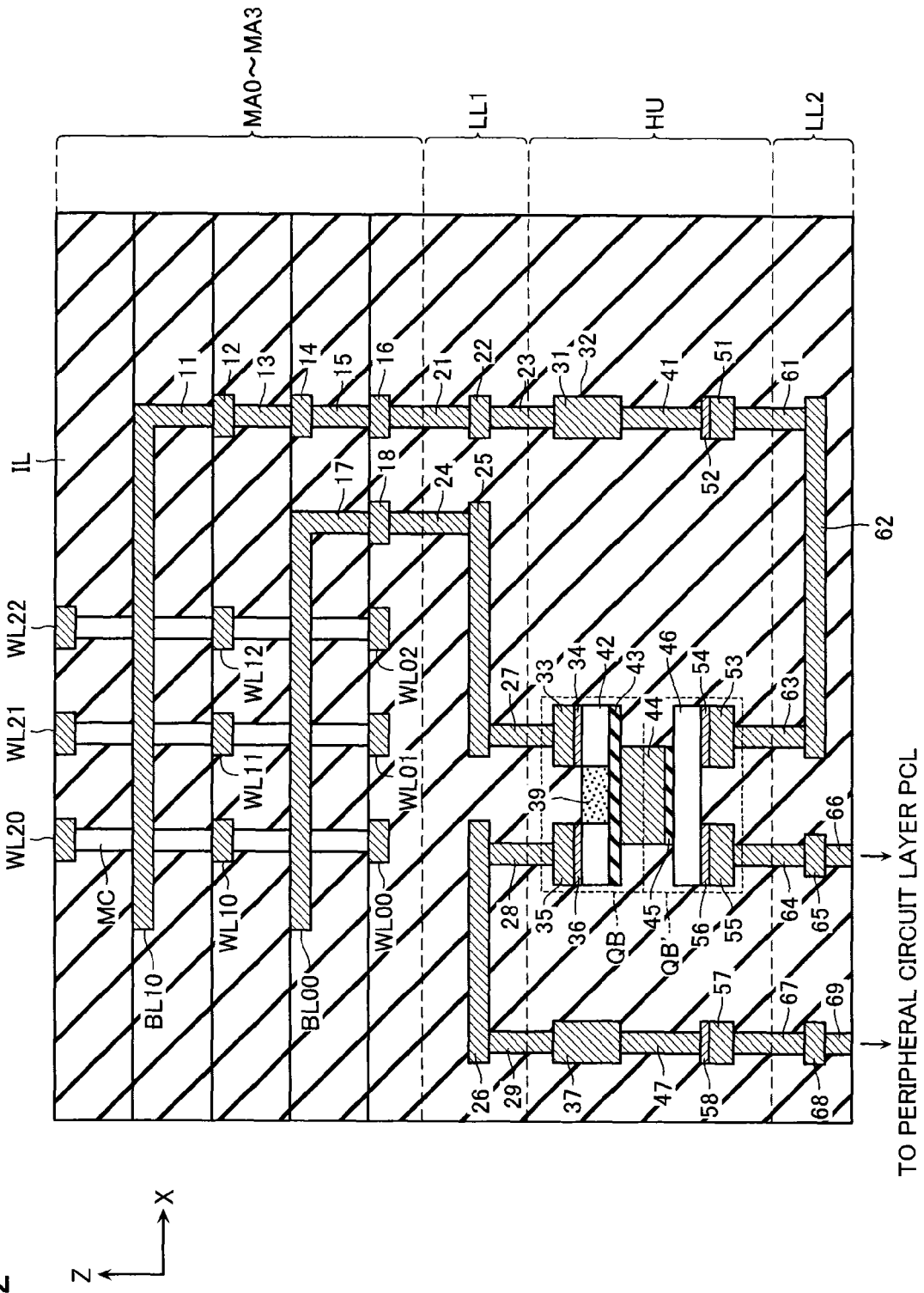
FIG. 22 is a cross-sectional view showing the configuration of a stacked memory cell array, a select transistor layer, and a wiring layer of the semiconductor memory device according to a second embodiment.

Then, a known method may be used to form the upper-layer vias, pads, and stacked memory cell array 1, thereby manufacturing the semiconductor memory device according to this embodiment shown in FIG. 22.

[Effects]

Again, in the semiconductor memory device according to this embodiment, the select transistors QB and QB' share the single gate electrode 44. The semiconductor memory device of this embodiment may also achieve the stable operations of the select transistors QB and QB'.

Figure 27:
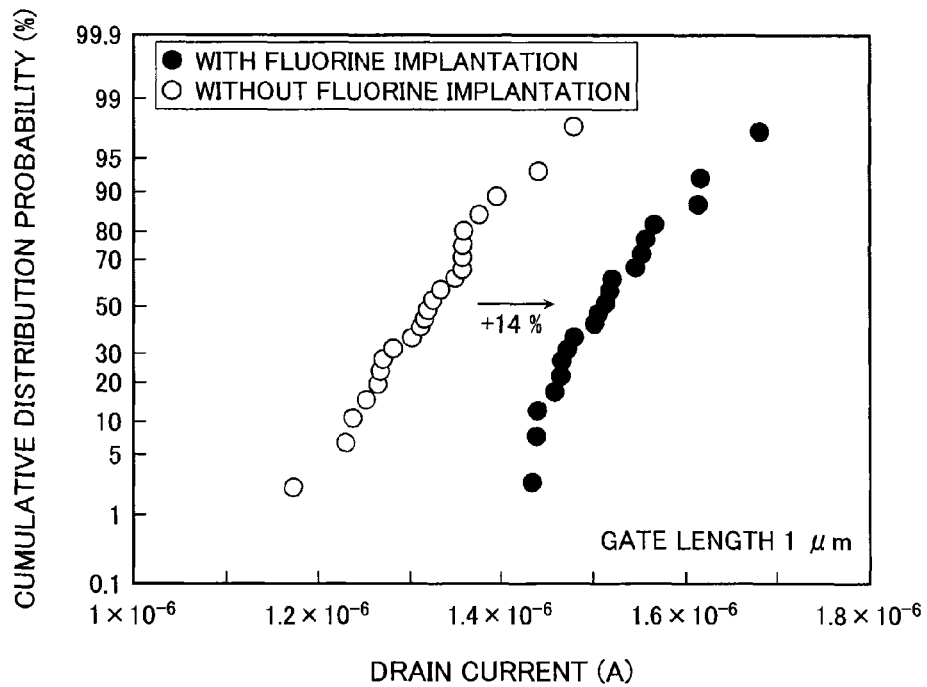
FIG. 27 and FIG. 28 are graphs illustrating the effects of the semiconductor memory device according to the second embodiment.
Figure 28:
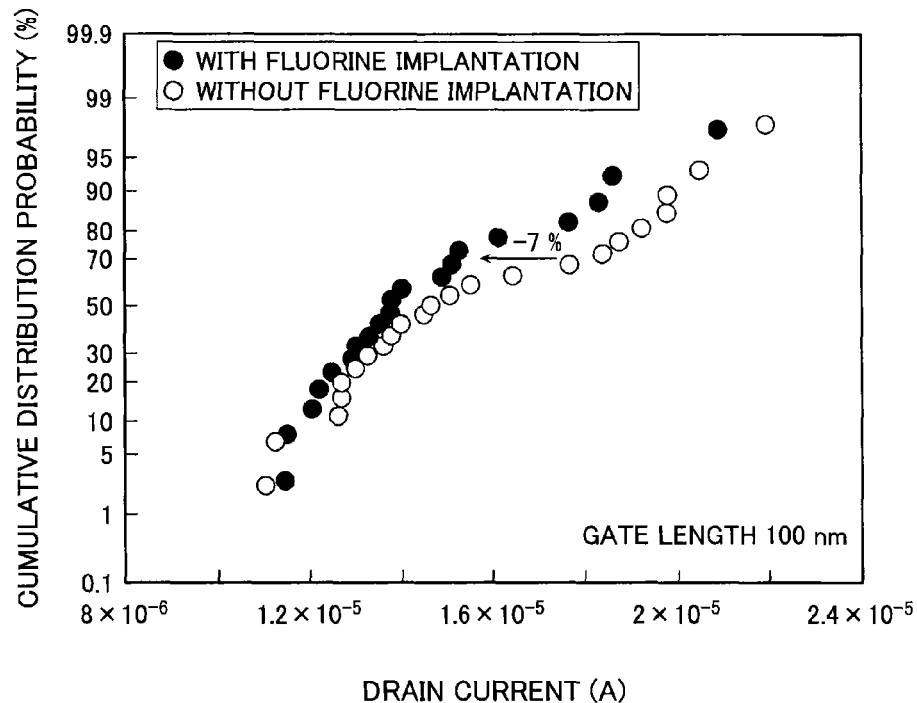

Next, a description is given of the characteristic change of the semiconductor memory device according to this embodiment by the impurity implantation into the polysilicon layer 42. FIG. 27 and FIG. 28 are graphs illustrating the effects of the semiconductor memory device according to this embodiment.

FIG. 27 and FIG. 28 show change in drain current in a select transistor QB having a polysilicon layer 42 with a gate width (the Y-direction width of the gate electrode 44) of 25 nm and a height of 25 nm. These figures show a case where fluorine implantation is performed with dose amount of $3 \times 10^{14}$ cm$^{-2}$ into the polysilicon layer 42, and a case where such fluorine implantation is not performed. FIG. 27 shows the results of a select transistor QB having a gate length (the X-direction distance between the source electrode 33 and the drain electrode 35) of 1 μm. FIG. 28 shows the results of a select transistor QB having a gate length of 100 nm. In addition, FIG. 27 and FIG. 28 each show 20 measurement results for each of the fluorine-implanted device and the no fluorine-implanted device.

With reference to FIG. 27, the select transistor QB having a gate length of 1 μm increases the average drain current by about 14% by the fluorine implantation. Meanwhile, with reference to FIG. 28, the select transistor QB having a gate length of 100 nm decreases the drain current by about 7% by the fluorine implantation. In the select transistor QB having a longer gate length, the drain current depends only on the channel mobility. In the select transistor QB having a shorter gate length, the drain current depends on both of the channel mobility and the source/drain region parasitic resistances. In this view, the results suggest that the fluorine implantation improves (increases) the channel mobility, but degrades (increases) the parasitic resistances of the source/drain regions.

Therefore, in order to provide a drain current-improvement effect by the fluorine implantation in the select transistor QB having a shorter gate length, the fluorine implantation should not affect the parasitic resistances of the source/drain regions. Therefore, it is necessary that the source/drain regions of the polysilicon layer 42 are not implanted with fluorine, and only the channel region is implanted with fluorine.

Note that it is considered that the fluorine implantation may improve the channel mobility as fluorine repairs the defects in the polysilicon layer 42 and in the interface between the polysilicon layer 42 and the gate oxide film 43. It is also considered that the fluorine implantation may degrade the parasitic resistances of the source/drain regions as fluorine inhibits the activation of the impurities in the source/drain regions.

In this embodiment, using the source electrode 33, the drain electrode 35, and the barrier metal layers 34 and 36 as the masks, an impurity is implanted only into the polysilicon layer 42 of the select transistor QB. This may greatly improve the drain current of the select transistor QB. In addition, as the source/drain regions of the polysilicon layer 42 are not implanted with fluorine, the parasitic resistances of the source/drain regions do not increase. Then, because the source electrode 33, the drain electrode 35, and the barrier metal layers 34 and 36 are used as the masks of the impurity implantation, the lithography process for forming the masks is unnecessary. This may reduce the cost of the manufacturing processes.

In this embodiment, the drain current of the upper-layer select transistor QB may be improved by the impurity implantation, and thus the drain current difference between the upper-layer select transistor QB and the lower-layer select transistor QB' may be reduced. Appropriate control of the amount of implanted impurity may completely eliminate the drain current difference between the upper-layer select transistor QB and the lower-layer select transistor QB'.

In the select transistor QB, the smaller the film thickness of the polysilicon layer 42 is, the lower the drain current is. Therefore, if the film thickness of the polysilicon layer 42 varies between the select transistors QB, then the drain current value may also vary between the select transistors QB. In this embodiment, the lower the film thickness of the polysilicon layer 42 of the select transistor QB is, the higher the number of impurities reaching the interface between the polysilicon layer 42 and the gate oxide film 43 is, thereby providing a larger current-improvement effect. This may reduce the drain current variation due to the film thickness variation of the polysilicon layer 42 between the select transistors QB.

Third Embodiment

Figure 29:
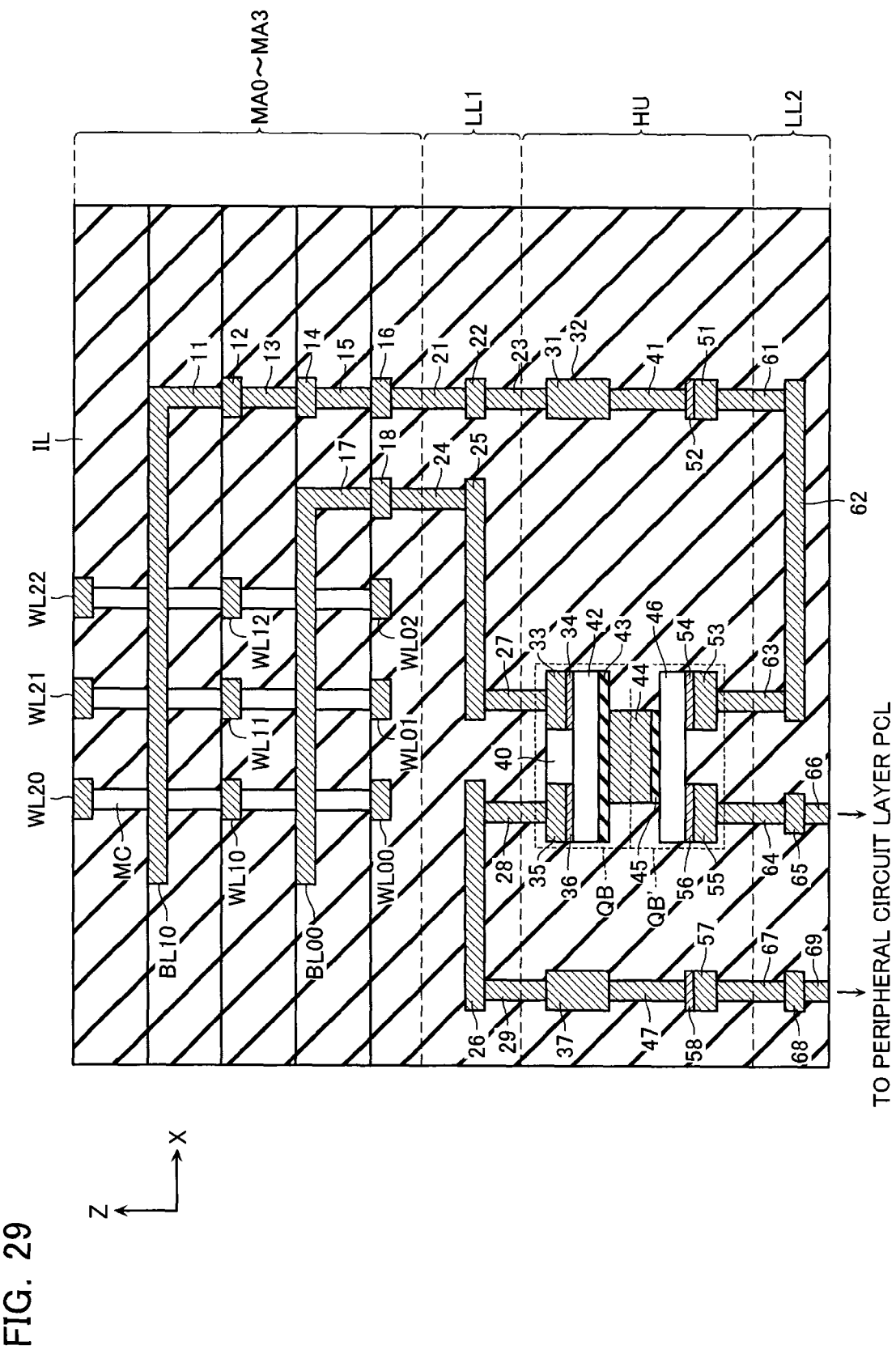
FIG. 29 is a cross-sectional view showing the configuration of a stacked memory cell array, a select transistor layer, and a wiring layer of the semiconductor memory device according to a third embodiment.

Next, with reference to FIG. 29, a third embodiment will be described. The entire configuration of a semiconductor memory device according to the third embodiment is similar to that in the first embodiment and thus its detailed description is omitted. In addition, like elements as those in the first embodiment are designated by like reference numerals, and repeated description thereof is omitted here.

In the semiconductor memory device according to this embodiment, the upper-layer select transistor QB and the lower-layer select transistor QB' are formed with transistors of different structures unlike the semiconductor memory device according to the first embodiment. With reference to FIG. 29, the configuration of the semiconductor memory device according to this embodiment will be described below.

[Structure of Select Transistor]

Again, in this embodiment, the select transistors QB and QB' are formed to be stacked in the Z-direction and share one gate electrode 44. The select transistors QB and QB' are configured to have a symmetrical shape about the gate electrode 44.

Here, in this embodiment, the upper-layer select transistor QB comprises, on the polysilicon layer 42, a stress insulating film 40 between the source electrode 33 and the drain electrode 35. The stress insulating film 40 may comprise a silicon nitride film, a silicon oxide film, or the like. The stress insulating film 40 may be a film that causes an tensile strain in the gate length direction (X-direction) between the source electrode 33 and the drain electrode 35 of the select transistor QB or a film that causes a compressive strain in the gate length direction.

If the select transistor QB is an n-type transistor, a stress insulating film 40 may be provided that causes a tensile strain in the gate length direction of the select transistor QB. If the select transistor QB is a p-type transistor, a stress insulating film 40 may be provided that causes a compressive strain in the gate length direction of the select transistor QB.

The method of manufacturing the semiconductor memory device according to this embodiment forms the source electrode 33, the drain electrode 35, and the barrier metal layers 34 and 36 according to the above embodiments, and then deposits the stress insulating film 40 and performs the CMP. The other processes are similar to those for the semiconductor memory device according to the above embodiments.

In addition, after the stress insulating film 40 is deposited, it may be thermally treated to increase the amount of strain caused in the polysilicon layer 42 of the select transistor QB.

[Effects]

Again, in the semiconductor memory device according to this embodiment, the select transistors QB and QB' share the single gate electrode 44. The semiconductor memory device of this embodiment may achieve the stable operations of the select transistors QB and QB'.

In the semiconductor memory device of this embodiment, the stress insulating film 40 causes strain in the polysilicon layer 42, which provides the channel region of the select transistor QB. The channel mobility may thus be improved. This may increase the drain current of the select transistor QB. In this embodiment, the drain current of the upper-layer select transistor QB may be improved by the stress insulating film 40, thus reducing the drain current difference between the upper-layer select transistor QB and the lower-layer select transistor QB'. Appropriate control of the characteristics of the stress insulating film 40 may completely eliminate the drain current difference between the upper-layer select transistor QB and the lower-layer select transistor QB'.

In addition, the method of manufacturing the semiconductor memory device according to this embodiment only replaces the step of depositing the interlayer dielectric film IL according to the first or second embodiment with the step of depositing the stress insulating film 40, thus requiring no additional process step or no cost increase in the manufacturing process.

In the select transistors QB and QB', the longer the gate length (the distance between the source electrode and the drain electrode) is, the lower the drain current is. Thus a device-to-device gate length variation may cause a device-to-device drain current value variation. In the semiconductor memory device of this embodiment, the longer the gate length of the select transistor QB is, the larger the volume of the stress insulating film 40 is, thereby providing a larger current-improvement effect. This may reduce the drain current variation due to the gate length variation between the select transistors QB.

Some embodiments have been described, but these embodiments are shown by way of example and are not intended to limit the scope of the invention. These new embodiments may be implemented in various other forms, and subjected to various omissions, replacements, and modifications without departing from the spirit of the present invention. These embodiments and variants thereof are within the scope and sprit of the invention, and are also within the scope of the invention as defined in the appended claims and the equivalents thereof.

For example, the channel and the source/drain regions of the select transistors QB and QB' may be implanted with an impurity (an n-type impurity for the n-type select transistor and a p-type impurity for the p-type select transistor). In this case, the select transistors may operate as the so-called junction less transistors, thus reducing the parasitic resistances of the source/drain regions.

In addition, if a plurality of select transistors are stacked in the select transistor layer HU, the upper-layer select transistors experience a lower heat load in the fabrication process. Therefore, the upper-layer select transistors have lower crystallinity in the polysilicon layer that provides the channel region. This may reduce the drain current. In the semiconductor memory device according to the above embodiments, the upper-layer select transistor QB having a shorter gate length than the lower-layer select transistor QB' or the upper-layer select transistor QB having a longer gate width than the lower-layer select transistor QB' may reduce the current difference between the upper-layer select transistor QB and the lower-layer select transistor QB'. Appropriate control of the gate length and the gate width may completely eliminate the current difference between the upper-layer select transistor QB and the lower-layer select transistor QB'.

Although the above embodiments have been described with respect to the bit-line select transistors QB connected to the bit-lines BL, this configuration may also be applicable to the word-line select transistors QW. If the word-lines WL provided in the different cell array layers MA are commonly connected, the word-line select transistors QW may be configured separately according to the comparative example.

What is claimed is:

1. A semiconductor memory device comprising:
   a memory cell array, the memory cell array comprising a plurality of first wiring lines, a plurality of second wiring lines extending crossing the first wiring lines, and a plurality of memory cells disposed at intersections of the first and second wiring lines, the memory cells being stacked in a direction perpendicular to a substrate, each memory cell comprising a variable resistance element; and
   a select transistor layer comprising a plurality of select transistors, each select transistor being operative to select any one of the first wiring lines or one of the second wiring lines,
   two select transistors being connected to two different respective first wiring lines, and being stacked in a direction perpendicular to the substrate, and the two select transistors being configured to share one gate electrode.

2. The semiconductor memory device according to claim 1, wherein
   one of the two select transistors is an upper-layer select transistor, the upper-layer select transistor has a source electrode and a drain electrode between which a stress insulating film is provided.

3. The semiconductor memory device according to claim 1, wherein
   one of the two select transistors is an upper-layer select transistor, the upper-layer select transistor has a channel region in which an impurity is included.

4. The semiconductor memory device according to claim 3, wherein
   one of the two select transistors is an upper-layer select transistor, the upper-layer select transistor has a source electrode and a drain electrode between which a stress insulating film is provided.

5. The semiconductor memory device according to claim 3, wherein the impurity includes fluorine.

6. The semiconductor memory device according to claim 1, the two select transistors comprise an upper-layer select transistor and a lower-layer select transistor, the upper-layer select transistor has a channel region in which an impurity is included, and the lower-layer select transistor has a channel region in which the impurity is not included.

7. The semiconductor memory device according to claim 6, wherein
the upper-layer select transistor has a source electrode and a drain electrode between which a stress insulating film is provided.

8. The semiconductor memory device according to claim 6, wherein the impurity includes fluorine.

9. The semiconductor memory device according to claim 1, wherein the two select transistors have a symmetrical shape about the gate electrode shared between the two select transistors.

10. A method of manufacturing a semiconductor memory, the semiconductor memory comprising:
a memory cell array, the memory cell array comprising a plurality of first wiring lines, a plurality of second wiring lines extending crossing the first wiring lines, and a plurality of memory cells disposed at intersections of the first and second wiring lines, the memory cells being stacked in a direction perpendicular to a substrate, each memory cell comprising a variable resistance element; and
a select transistor layer comprising a plurality of select transistors, each select transistor being operative to select any one of the first wiring lines or one of the second wiring lines,
the method comprising:
forming a first select transistor above the substrate;
forming a second select transistor above the first select transistor, the second select transistor sharing one gate electrode with the first select transistor; and
connecting the first and second select transistors to two different respective first wiring lines.

11. The method of manufacturing a semiconductor memory device according to claim 10, further comprising providing a stress insulating film between a source electrode and a drain electrode of the second select transistor.

12. The method of manufacturing a semiconductor memory device according to claim 10, further comprising implanting an impurity into a channel region of the second select transistor.

13. The method of manufacturing a semiconductor memory device according to claim 12, further comprising providing a stress insulating film between a source electrode and a drain electrode of the second select transistor.

14. The method of manufacturing a semiconductor memory device according to claim 10, wherein the first and second select transistors have a symmetrical shape about the gate electrode.

* * * * *